United States Patent
Fudaba et al.

(10) Patent No.: US 8,254,857 B2
(45) Date of Patent: Aug. 28, 2012

(54) RADIO COMMUNICATION DEVICE AND RADIO COMMUNICATION METHOD

(75) Inventors: Nobukazu Fudaba, Kawasaki (JP); Hiroyoshi Ishikawa, Kawasaki (JP); Hajime Hamada, Kawasaki (JP); Yuichi Utsunomiya, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 12/874,453

(22) Filed: Sep. 2, 2010

(65) Prior Publication Data

US 2011/0053532 A1  Mar. 3, 2011

(30) Foreign Application Priority Data

Sep. 3, 2009  (JP) ................................. 2009-204006

(51) Int. Cl.
*H01Q 11/12*  (2006.01)
(52) U.S. Cl. ................ 455/127.1; 455/91; 455/114.3; 455/127.5; 375/295; 375/296; 375/312
(58) Field of Classification Search ................ 455/91, 455/114.3, 127.1, 127.5; 375/295, 296, 312
See application file for complete search history.

(56) References Cited

U.S. PATENT DOCUMENTS

| 7,602,243 | B2 | 10/2009 | Murao | |
|---|---|---|---|---|
| 7,706,467 | B2 | 4/2010 | Kenington | |
| 2009/0180566 | A1* | 7/2009 | Kimura et al. | 375/265 |
| 2010/0178886 | A1* | 7/2010 | Pennec et al. | 455/127.1 |
| 2010/0308910 | A1* | 12/2010 | Barnes | 330/149 |

FOREIGN PATENT DOCUMENTS

| JP | 2006-174418 | 6/2006 |
|---|---|---|
| JP | 2006-177899 | 7/2006 |
| JP | 2008-124947 | 5/2008 |

* cited by examiner

*Primary Examiner* — Tuan Pham
(74) *Attorney, Agent, or Firm* — Fujitsu Patent Center

(57) ABSTRACT

A radio communication device includes a power amplifier to amplify a transmit signal, a control unit to generate a voltage control signal for defining power to be supplied to the power amplifier in accordance with a conversion curve expressed using a polynomial series based on an envelope signal obtained from the transmit signal and determine the polynomial series based on an efficiency of the power amplifier, and a power source unit to supply the power to the power amplifier based on the voltage control signal, wherein the control unit divides an amplitude range of the envelope signal on the conversion curve into a plurality of sections and determines the polynomial series based on at least one of the plurality of sections.

14 Claims, 22 Drawing Sheets

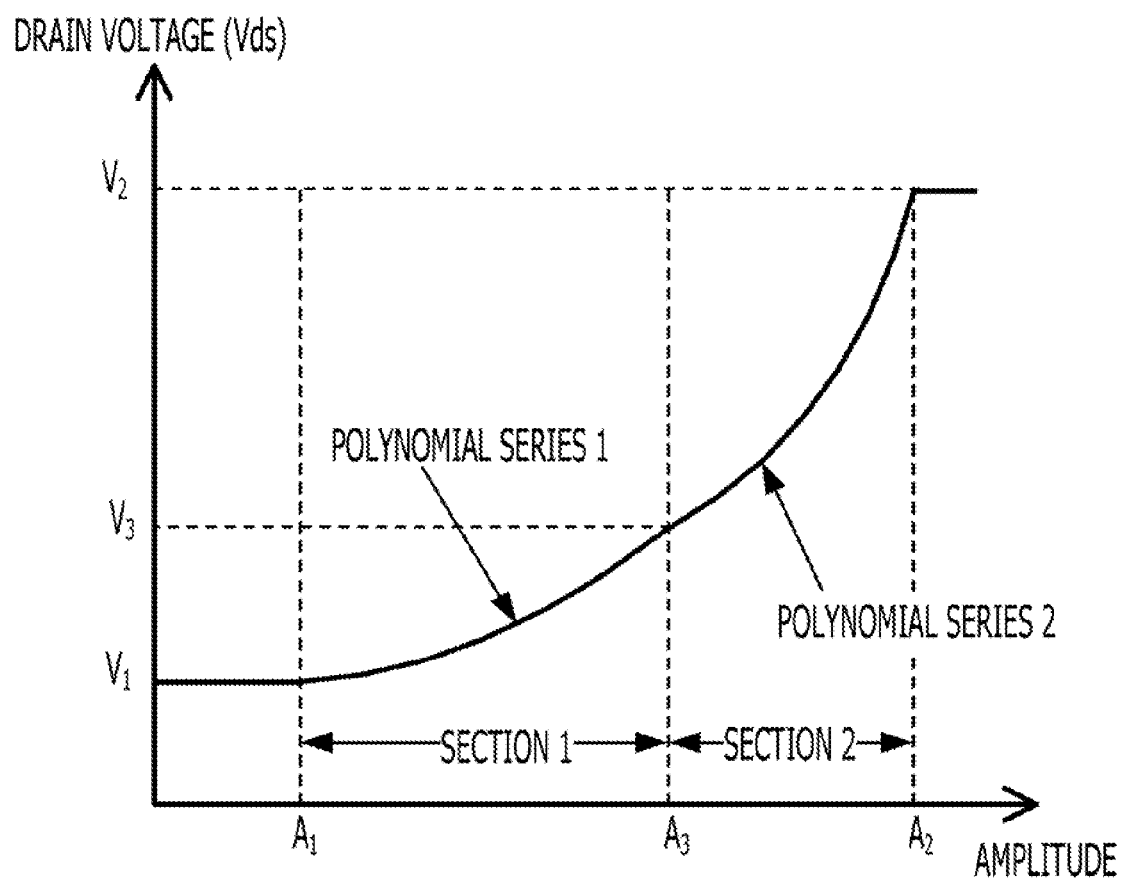

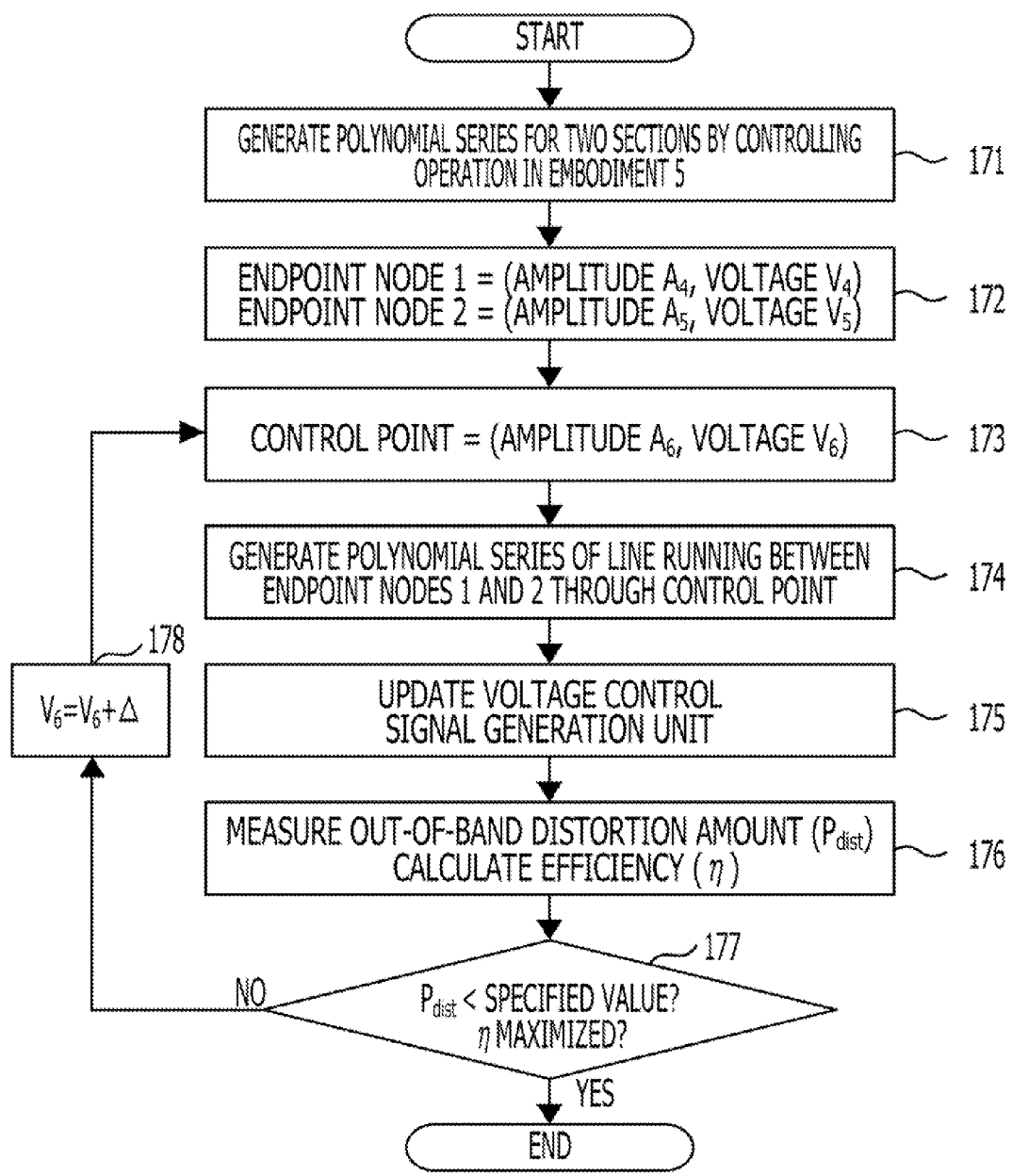

RADIO COMMUNICATION DEVICE AND RADIO COMMUNICATION METHOD

CROSS-REFERENCE TO RELATED APPLICATIONS

This application is based upon and claims the benefit of priority of the prior Japanese Patent Application No. 2009-204006, filed on Sep. 3, 2009, the entire contents of which are incorporated herein by reference.

FIELD

The embodiment(s) discussed herein are related to radio communication device and radio communication method.

BACKGROUND

The band of a transmit signal continues to increase as the speed at which radio communication is performed increases. Therefore, in a radio communication device, a high linearity is asked for a transmission unit in order to suppress degradation of the signal quality. However, in many cases, the linearity and the power efficiency of a power amplifier used in a transmission unit as mentioned above is incompatible. Therefore, in order to linearly amplify a wide band signal which is high in terms of peak-to-average power ratio (hereinafter, referred to as PAPR), it may be necessary to operate the power amplifier in a state that sufficient back-off is maintained and hence the efficiency of the transmission unit may be reduced accordingly.

As means for solving the above mentioned problem, an envelope tracking (hereinafter, referred to as an ET) system and an envelope elimination and restoration (hereinafter, referred to as an EER) system configured to control a drain voltage (or a collector voltage) of a power amplifier in accordance with a fluctuation in envelope of a transmit signal are proposed.

FIGS. 1 and 2 are diagrams illustrating a configuration of an existing ET system and the operational principle thereof. In the ET system, an envelope which has been extracted from a transmit signal using an envelope extraction unit is input into a variable power source via a digital-to-analog converter as a voltage control signal which is generated using a voltage control signal generation unit to be used to control the drain voltage of the power amplifier. Instead of applying a "fixed biased voltage (FIG. 2)" in order to output constant peak power, a "drain voltage in an envelope tracking operation (FIG. 2)" is applied to the power amplifier to output variable signal power. According to this operation, if the power amplifier is normally operated in a nearly saturated region, power consumption is "reduced by performing an envelope tracking operation (FIG. 2)". Therefore, the power efficiency may be improved. In addition, in the ET system, it is preferable to generate a voltage control signal with which the efficiency is maximized while maintaining an out-of-band distortion level which is lower than a standard value.

A configuration which includes a voltage control signal generation unit contents of which may be adaptively updated is proposed so as to cope with a variation among power amplifiers and a fluctuation in characteristic of each power amplifier in an operation. In a technique used in the above mentioned configuration and others, the voltage control signal is generated using a look-up table and polynomial series and the contents thereof is updated in accordance with an adaptive algorithm. In addition, in a technique for controlling the impedance of an input/output matching circuit in accordance with an envelope of a transmit signal, use of polynomials in generation of a control signal of the input/output matching circuit is proposed. However, use of the look-up table may lead to an increase in necessary memory amount.

SUMMARY

According to an aspect of the invention, a radio communication device includes a power amplifier to amplify a transmit signal, a control unit to generate a voltage control signal for defining power to be supplied to the power amplifier in accordance with a conversion curve expressed using a polynomial series based on an envelope signal obtained from the transmit signal and determine the polynomial series based on an efficiency of the power amplifier, and a power source unit to supply the power to the power amplifier based on the voltage control signal, wherein the control unit divides an amplitude range of the envelope signal on the conversion curve into a plurality of sections and determines the polynomial series based on at least one of the plurality of sections.

The object and advantages of the invention will be realized and attained by at least the features, elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 15 is a diagram illustrating an example of a manner of dividing an amplitude range into sections according to an embodiment 5;

FIG. 22 is a diagram illustrating an example of a flowchart of an operation of an adaptive control unit according to the embodiment 7.

DESCRIPTION OF EMBODIMENTS

Figure 1:
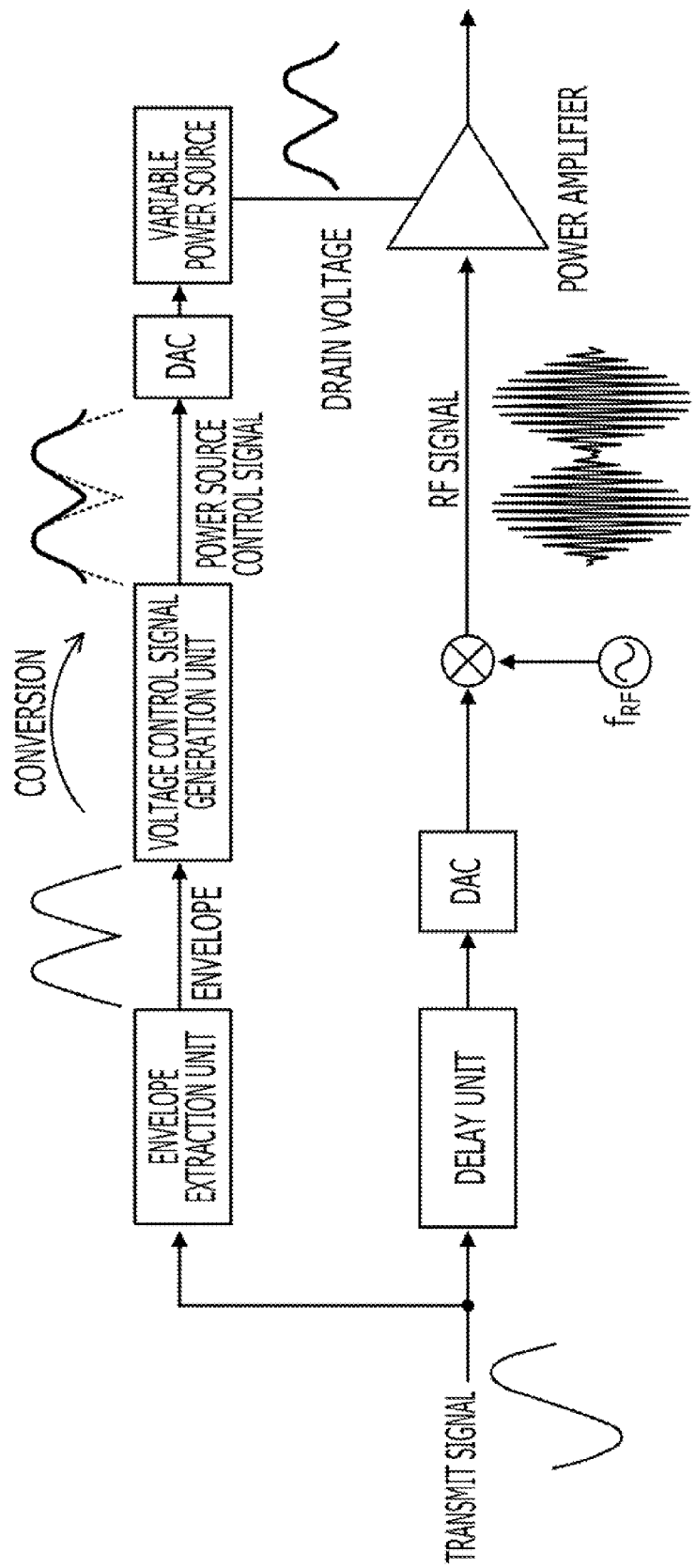
FIG. 1 is a block diagram illustrating a configuration of an existing ET type power amplifier.
Figure 2:
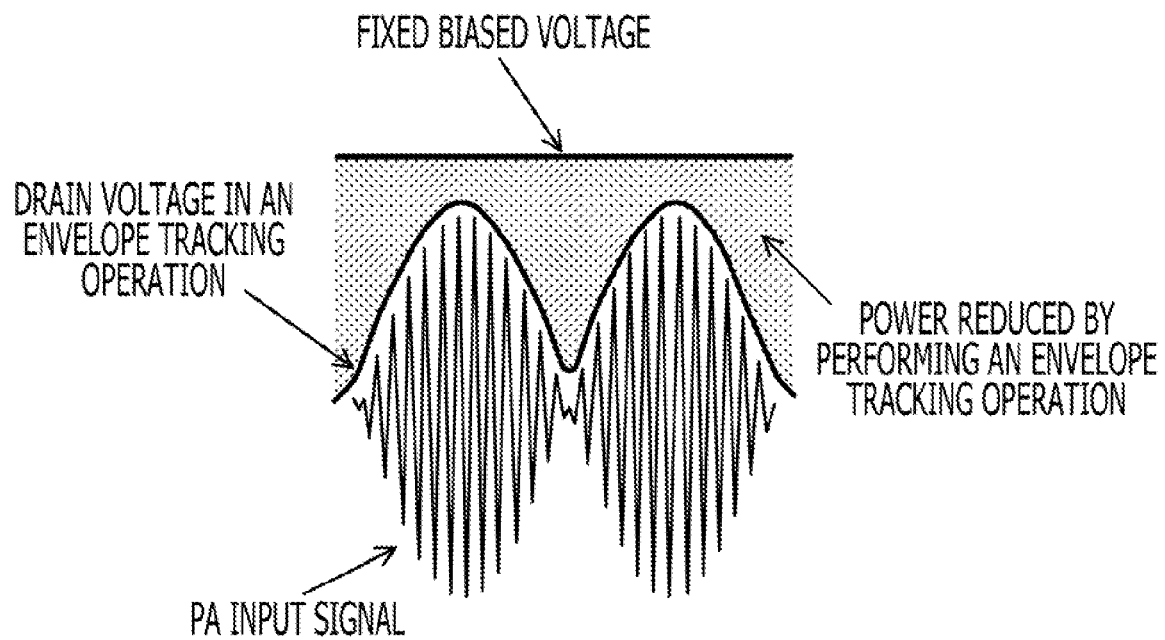
FIG. 2 is a diagram illustrating an example of power consumption reduction attained using an ET type power amplifier.

A conversion curve (Pout-Vds curve) indicating a relation between an envelope of a transmit signal and a drain voltage applied in an operation of an ET system is determined on the basis of a relation between an output power and an efficiency attained at each drain voltage of a power amplifier. An optimum conversion curve differs for different power amplifiers. The difference is at least partly based on the influence of a variation in characteristic among different power amplifiers and a variation in reproducibility among matching circuits.

However, in an existing device, the conversion curve is determined under the assumption that a power amplifier concerned has representative characteristics and hence the existing device has a problem in that the efficiency of the power amplifier may not be maximized with a voltage control signal which is generated in accordance with the conversion curve so determined.

In addition, when an optimum conversion curve is to be generated in accordance with an adaptive algorithm, in an existing device, approximation is performed using a polynomial series which covers the entire amplitude range of a transmit signal. Therefore, use of higher-order polynomial is unavoidably used and hence much time is taken to execute the adaptive algorithm. When approximation is performed using a lower-order polynomial in order to reduce the time taken to execute the adaptive algorithm, an insufficiently approximated conversion curve is generated and hence a sufficient efficiency is hardly attained.

The present invention aims to obtain a highly efficient conversion curve regardless of the use of polynomial series of lower orders for an individual power amplifier.

A radio communication device according to an embodiment includes a power amplifier for amplifying a transmit signal, a control unit for generating a voltage control signal for defining power to be supplied to the power amplifier in accordance with a conversion curve expressed using a polynomial series on the basis of an envelope signal obtained from the transmit signal and determining the polynomial series on the basis of the efficiency of the power amplifier and a power source unit for applying the power to the power amplifier on the basis of the voltage control signal. The control unit controls to divide an amplitude range of the envelope signal on the conversion curve into a plurality of sections and to determine the polynomial series of at least one section.

A radio communication method according to another embodiment includes: amplifying a transmit signal using a power amplifier; generating a voltage control signal for defining power to be supplied to the power amplifier in accordance with a conversion curve expressed using a polynomial series on the basis of an envelope signal obtained from the transmit signal; supplying the power to the power amplifier on the basis of the voltage control signal; and determining the polynomial series on the basis of the efficiency of the power amplifier. The determining of the polynomial series includes: dividing an amplitude range of the envelope signal on the conversion curve into a plurality of sections; and determining the polynomial series of at least one section.

As a result, it may become possible to obtain a highly efficient conversion curve using polynomial series of lower orders for individual power amplifier.

Next, embodiments will be described in detail with reference to the accompanying drawings.

Figure 3:
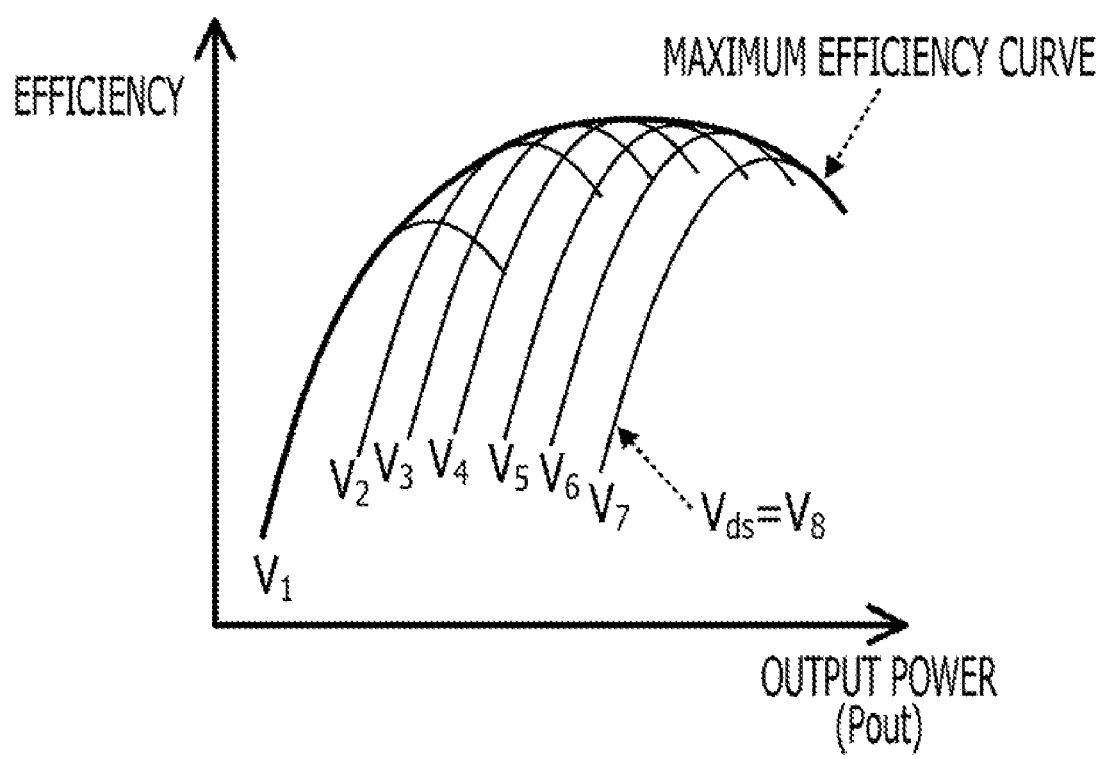
FIG. 3 is a diagram illustrating an example of a relation between an output power and an efficiency attained at each drain voltage of a power amplifier.

FIG. 3 is a diagram illustrating an example of a relation between an output power (Pout) and an efficiency attained at each drain voltage ($V_1$ to $V_8$) of a power amplifier. The graph in FIG. 3 illustrates an example in which each efficiency relative to each Pout is measured in a state in which a drain voltage to be applied to the power amplifier is fixed (for example, $V_8$). In the graph, each Pout corresponds to each envelope of the transmit signal. A maximum efficiency curve is obtained by connecting points of the respective output powers at which the respective efficiencies are maximized with one another. A maximum efficiency conversion curve (a Pout-Vds curve) along which each envelope of the transmit signal is converted to each voltage control signal is obtained from the maximum efficiency curve.

Figure 4:
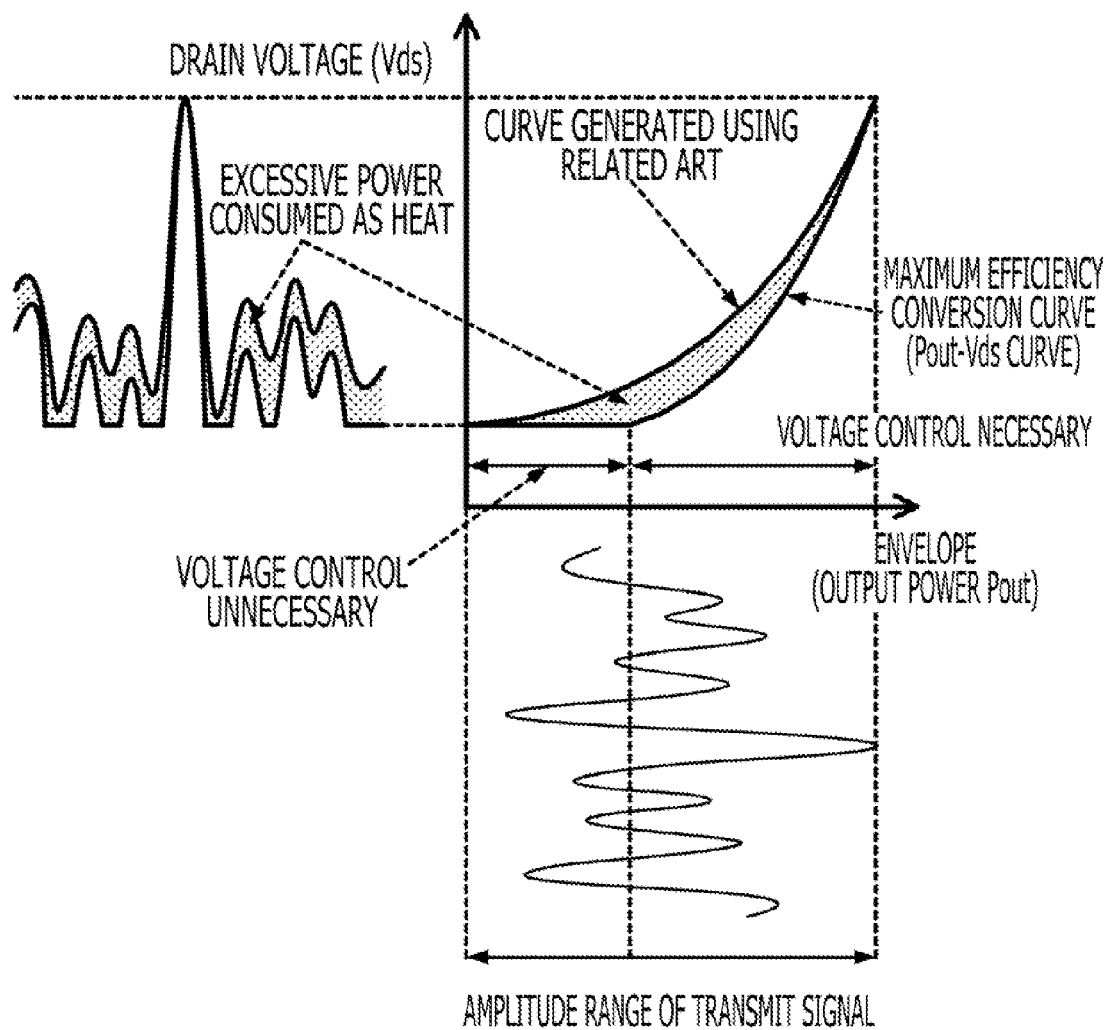
FIG. 4 is a diagram illustrating an example of a manner of generating a drain voltage waveform on the basis of an envelope of a transmit signal.

FIG. 4 is a diagram illustrating an example of a manner of generating a drain voltage waveform on the basis of envelopes of a transmit signal. The maximum efficiency conversion curve illustrated in FIG. 4 is obtained by re-drawing the maximum efficiency curve obtained by the manner illustrated in FIG. 3 as a curve illustrating a relation between each output power (Pout, that is, each envelope of the transmit signal) and each drain voltage. A (conversion) curve generated by related art is also illustrated in FIG. 4 as a reference.

As understood from the maximum efficiency conversion curve illustrated in FIG. 4, in a region in which the amplitude of the transmit signal is small, the efficiency of the power amplifier is not increased very much in spite of changing the drain voltage which is applied to the power amplifier. Therefore, for example, a constant drain voltage may be applied to the power amplifier. On the other hand, in a region in which the amplitude of the transmit signal is large, it may be possible to increase the efficiency of the power amplifier by changing the drain voltage which is applied to the power amplifier.

Thus, the efficiency of the power amplifier may be increased, for example, by discriminating a region in which the drain voltage is controlled from a region in which the drain voltage is not controlled in accordance with each envelope of the transmit signal.

On the other hand, the curve generated by related art in FIG. 4 is obtained by making an adaptive algorithm act on the entire amplitude range of a transmit signal. Therefore, the curve does not sufficiently approximate the maximum efficiency conversion curve and hence the power of the amount corresponding to a meshed part in FIG. 4 is consumed as heat.

Figure 5:
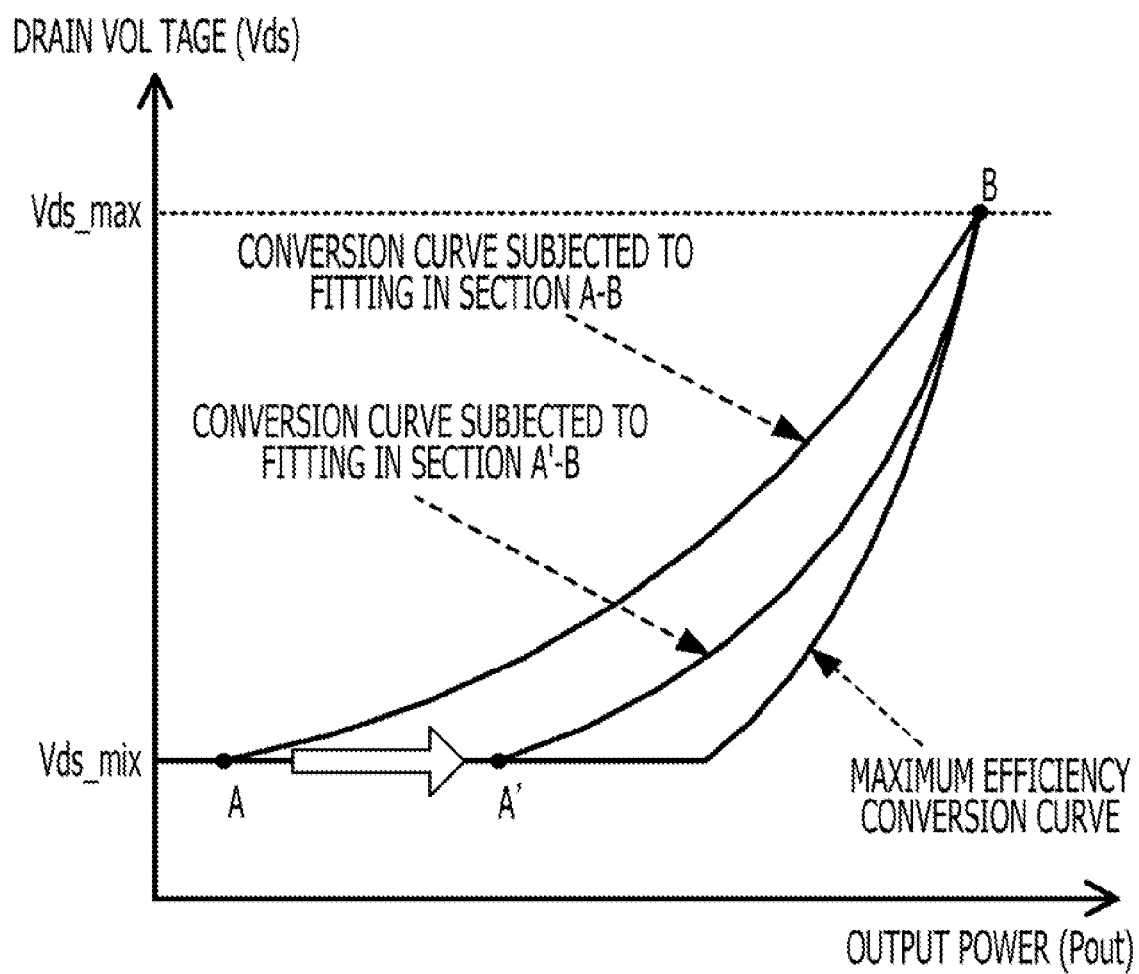
FIG. 5 is a diagram illustrating an example of fitting of conversion curves for respective sections.

FIG. 5 is a diagram illustrating an example of a manner of controlling conversion curves by being subjected to fitting in respective sections. In FIG. 5, a maximum efficiency conversion curve, a conversion curve which has been subjected to fitting in a section A-B so as to approximate the maximum efficiency conversion curve using a polynomial series and a conversion curve which has been subjected to fitting in a section A'-B in the same manner as the above are illustrated. It is found that the conversion curve which has been subjected to fitting in the section A'-B is more approximate to the maximum efficiency conversion curve than the conversion curve which has been subjected to fitting in the section A-B.

Figure 6:
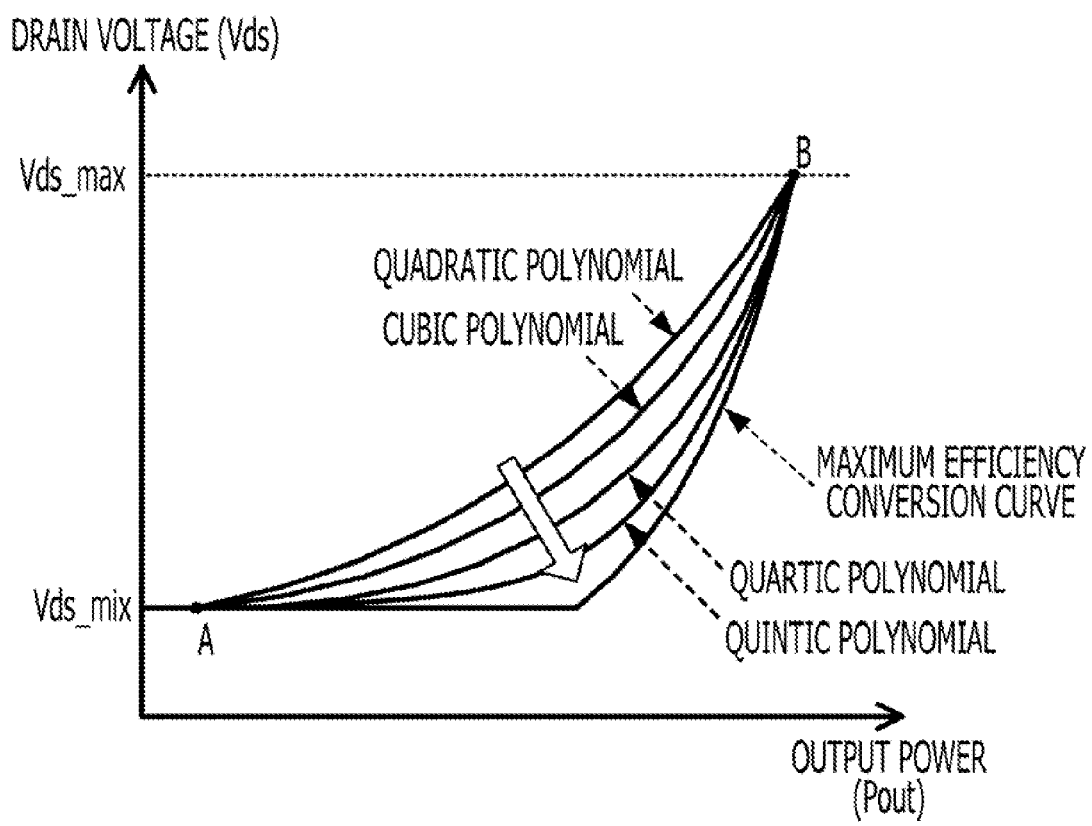
FIG. 6 is a diagram illustrating an example of fitting of conversion curves using polynomial series of respective orders.

FIG. 6 is a diagram illustrating an example of a manner of controlling conversion curves using polynomial series of respective orders. In FIG. 6, a maximum efficiency conversion curve and curves respectively expressed by a quadratic polynomial, a cubic polynomial, a quartic polynomial, a quintic polynomial and so on so as to approximate the maximum efficiency conversion curve by being subjected to fitting in the section A-B are illustrated. It is found that the higher the order of the polynomial which is used for approximation, the more the corresponding curve resembles the maximum efficiency conversion curve.

Figure 7:
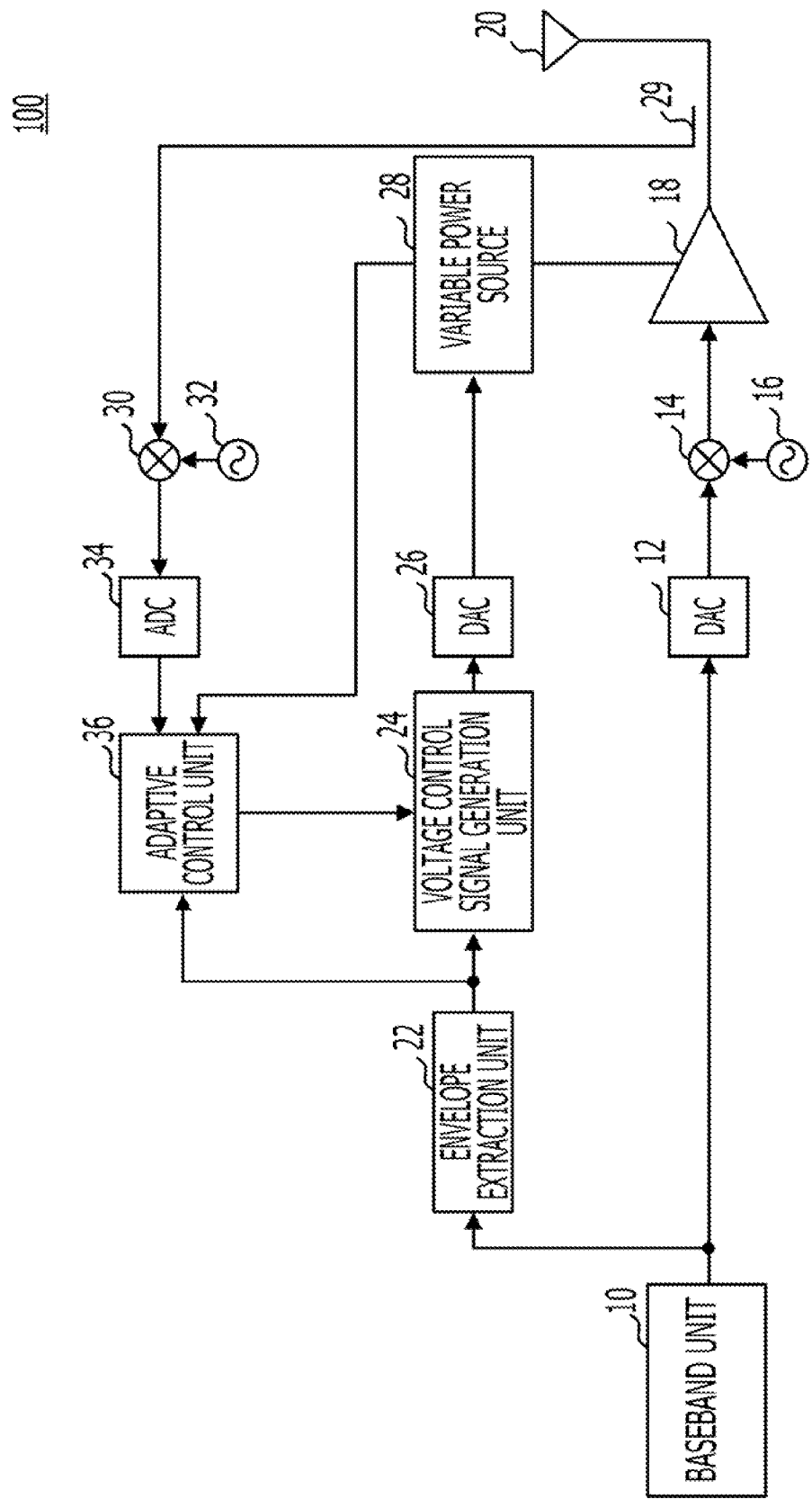
FIG. 7 is a block diagram illustrating an example of a configuration of a radio communication device using an ET type power amplifier according to an embodiment.

FIG. 7 is a block diagram illustrating an example of a configuration of a radio communication device using an ET type power amplifier according to an embodiment.

A radio communication device 100 includes elements as follows. That is, the device 100 includes a baseband unit 10 for converting a baseband signal to a transmit signal, a digital-to-analog converter (DAC) 12 for converting the converted transmit signal to an analog signal, a modulation unit 14 for up-converting the transmit signal which has been converted to the analog signal to an output signal with a carrier signal generated from a local oscillator 16 and a power amplifier 18 for power-amplifying the up-converted output signal and transmitting the power-amplified output signal via an antenna 20. The drain voltage of the power amplifier 18 is applied from a variable power source 28. The variable power source 28 is implemented using a power source module for changing the drain voltage in accordance with a voltage control signal.

The radio communication device 100 also includes an envelope (Env) extraction unit 22 for extracting an envelope from the transmit signal which has been output from the baseband unit 10, a voltage control signal generation unit (a voltage control unit) 24 for generating a voltage control signal on the basis of the extracted envelope, a digital-to-analog (DAC) converter 26 for converting the generated voltage control signal to an analog signal and the above mentioned variable power source 28 for supplying the drain voltage to the power amplifier 18 on the basis of the voltage control signal which has been converted to the analog signal. The envelope extraction unit 22, the voltage control signal generation unit 24 and an adaptive control unit 36 may be implemented using digital circuits such as, for example, FPGAs, ASICs and the like and correspond to a control unit recited in the claims.

The voltage control signal generation unit 24 generates a voltage control signal from an envelope of a transmit signal using a polynomial series indicating the curve, for example, illustrated in FIG. 3 or 4 and expressed by the following numerical formula, $$y = a + bx + cx^2 + dx^3 +$$  (Numerical Formula 1)

In the numerical formula, a, b, c, d, . . . are positive or negative constants. The above mentioned polynomial series is generated using the adaptive control unit 36 which will be described later.

The radio communication device 100 further includes the following elements. That is, the device 100 includes a coupler 29 for fetching an amplifier output signal out of an output from the power amplifier 18, a demodulation unit 30 for down-converting the fetched amplifier output signal on the basis of a carrier signal generated from a local oscillator 32 and an analog-to-digital converter (ADC) 34 for converting the down-converted signal to a digital signal.

The radio communication device 100 still further includes the above mentioned adaptive control unit 36. The amplifier output signal which has been down-converted and then converted to the digital signal, a power monitor signal indicative of the power that the variable power source 28 supplies to the power amplifier 18 and the envelope signal are input in the adaptive control unit 36. The adaptive control unit 36 is, for example, a digital signal processor and determines a polynomial series to be supplied to the voltage control signal generation unit 24 on the basis of a distortion of a signal included in the output from the power amplifier 18 which is determined on the basis of the amplifier output signal and the envelope signal and the power which is indicated by the power monitor signal and is supplied to the power amplifier 18. Preferably, the adaptive control unit 36 determines a polynomial series in accordance with which such a conversion curve as to minimize the power supplied to the power amplifier 18 while reducing the distortion of the signal included in the output from the power amplifier 18 to a desired level is obtained.

Next, the operation of the adaptive control unit 36 will be described in more detail in relation to embodiments thereof.

Embodiment 1

Figure 8:
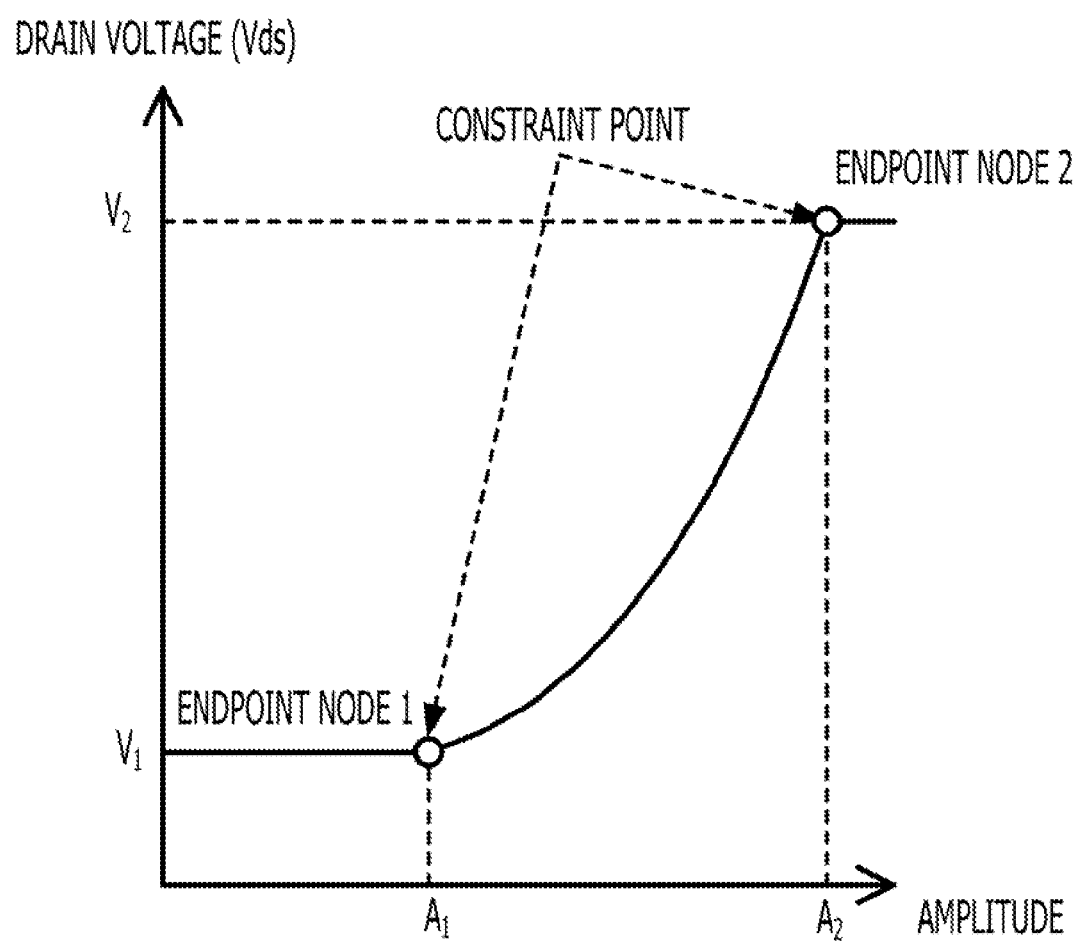
FIG. 8 is a diagram illustrating an example of a manner of setting constraint points according to an embodiment 1.

FIG. 8 is a diagram illustrating an example of a manner of setting constraint points according to an embodiment 1. In the example illustrated in FIG. 8, the horizontal axis indicates an amplitude of an envelope of a transmit signal input into the voltage control signal generation unit 24 and the vertical axis indicates a drain voltage that the variable power source 28 outputs in accordance with a voltage control signal which is output from the voltage control signal generation unit 24. The adaptive control unit 36 sets an endpoint node 1 (the amplitude: $A_1$, the drain voltage: $V_1$) and an endpoint node 2 (the amplitude: $A_2$, the drain voltage: $V_2$) in an amplitude range (a section $A_1$-$A_2$ (in which the amplitude changes from $A_1$ to $A_2$) on the horizontal axis) which is to be expressed using a polynomial series as constraint points and generates a polynomial series in accordance with which a curve is drawn between these two endpoint nodes. The adaptive control unit 36 loads the generated polynomial series to the voltage control signal generating unit 24 and appropriately updates the contents thereof.

Therefore, the adaptive control unit 36 may make a conversion curve more effectively approximate the maximum efficiency conversion curve even when a lower-order polynomial series is used and may generate a more effective voltage control signal.

As a result, it may become possible for the voltage control signal generation unit 24 to make the variable power source 28 supply the constant drain voltage $V_1$ to the power amplifier 18 in a section in which the amplitude changes from zero to $A_1$ and then supply a drain voltage which changes in proportion to the slope of the conversion curve which is drawn between the endpoint nodes 1 and 2 to the power amplifier 18 in the section in which the amplitude changes from $A_1$ to $A_2$.

Embodiment 2

Figure 9:
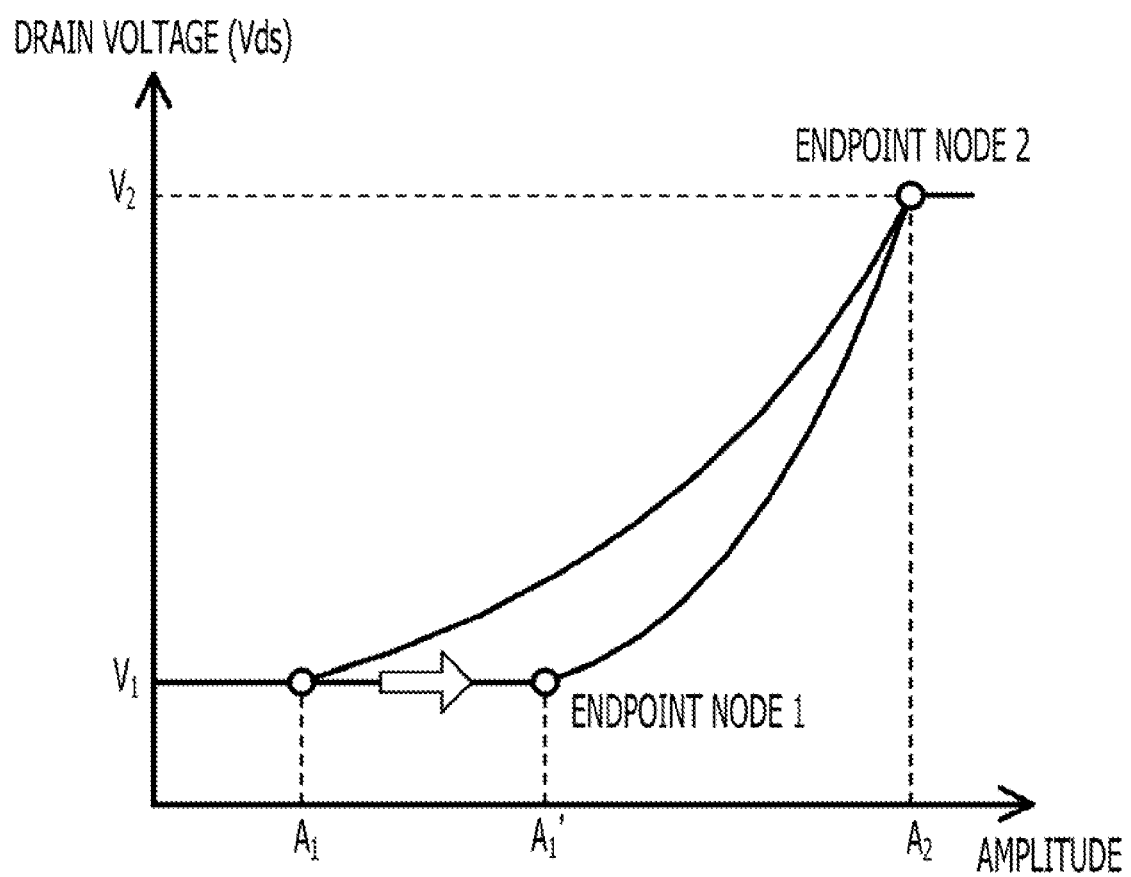
FIG. 9 is a diagram illustrating an example of a manner of setting constraint points according to an embodiment 2.

FIG. 9 is a diagram illustrating an example of a manner of setting constraint points according to an embodiment 2. In the embodiment 2, although two endpoint nodes are used as the constraint points as in the case in the embodiment 1, the position of one of the endpoint nodes is adjusted.

It is assumed that the endpoint node 1 is defined as a lower limit end of a range of a conversion curve which is expressed using a polynomial series. In the above mentioned situation, the voltage at the endpoint node 1 is constrained to $V_1$ and the position at which the amplitude $A_1$ is obtained is adjusted, thereby adjusting the range which is expressed using the polynomial series.

Figure 10:
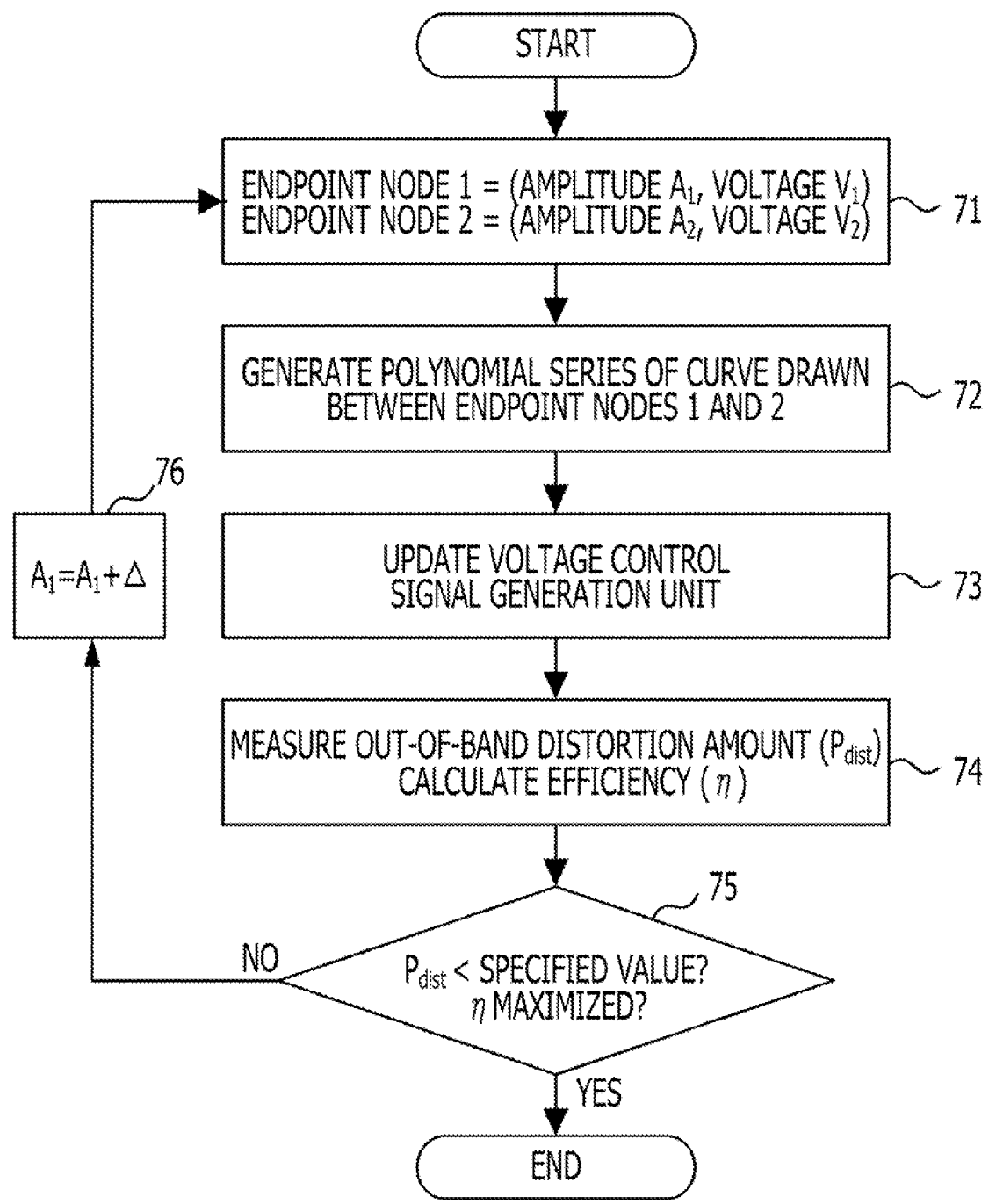
FIG. 10 is a diagram illustrating an example of a flowchart of an operation of an adaptive control unit according to the embodiment 2.

FIG. 10 is a diagram illustrating an example of a flowchart of the operation of the adaptive control unit according to the embodiment 2. The adaptive control unit 36 determines the initial values at the endpoint node 1 (the amplitude: $A_1$, the voltage: $V_1$) and the endpoint node 2 (the amplitude: $A_2$, the voltage: $V_2$) (step 71). Then, the adaptive control unit 36 generates a polynomial series of a curve which is drawn between the endpoint nodes 1 and 2 while changing the amplitude $A_1$ at the endpoint node 1 by a value $\Delta$ each time (step 72) and updates the contents of the voltage control signal generation unit 24 (step 73). Then, the adaptive control unit 36 measures an out-of-band distortion level Pdist and a Pout from a feedback signal in an output from the power amplifier to measure a power consumption Psrc of the variable power source so as to calculate an efficiency $\eta$=Pout/Psrc of the power amplifier every time the amplitude $A_1$ at the lower limit end is set (step 74). Next, the loop is repeated until the amplitude $A_1$ of a value with which the out-of-band distortion level Pdist is less than a specified value which has been determined in advance and the efficiency $\eta$ is maximized is found (steps 75 and 76). The amplitude $A_1$ of the value with which the efficiency $\eta$ is maximized may be obtained when the efficiency $\eta$ does not change with changing the amplitude $A_1$ by the value $\Delta$ or an amount of change is less than a desired amount. As one alternative, each efficiency $\Delta$ corresponding to each amplitude $A_1$ may be stored in a memory to obtain the amplitude $A_1$ of the value with which the efficiency $\Delta$ is maximized on the basis of the values of the efficiency stored in the memory.

As another alternative, the position of an upper limit end may be adjusted, instead of adjusting the lower limit end or adjustment of the positions of the both endpoint nodes may be possible.

According to the above mentioned operation, it may become possible to adjust the endpoint nodes to optimum positions.

Embodiment 3

Figure 11:
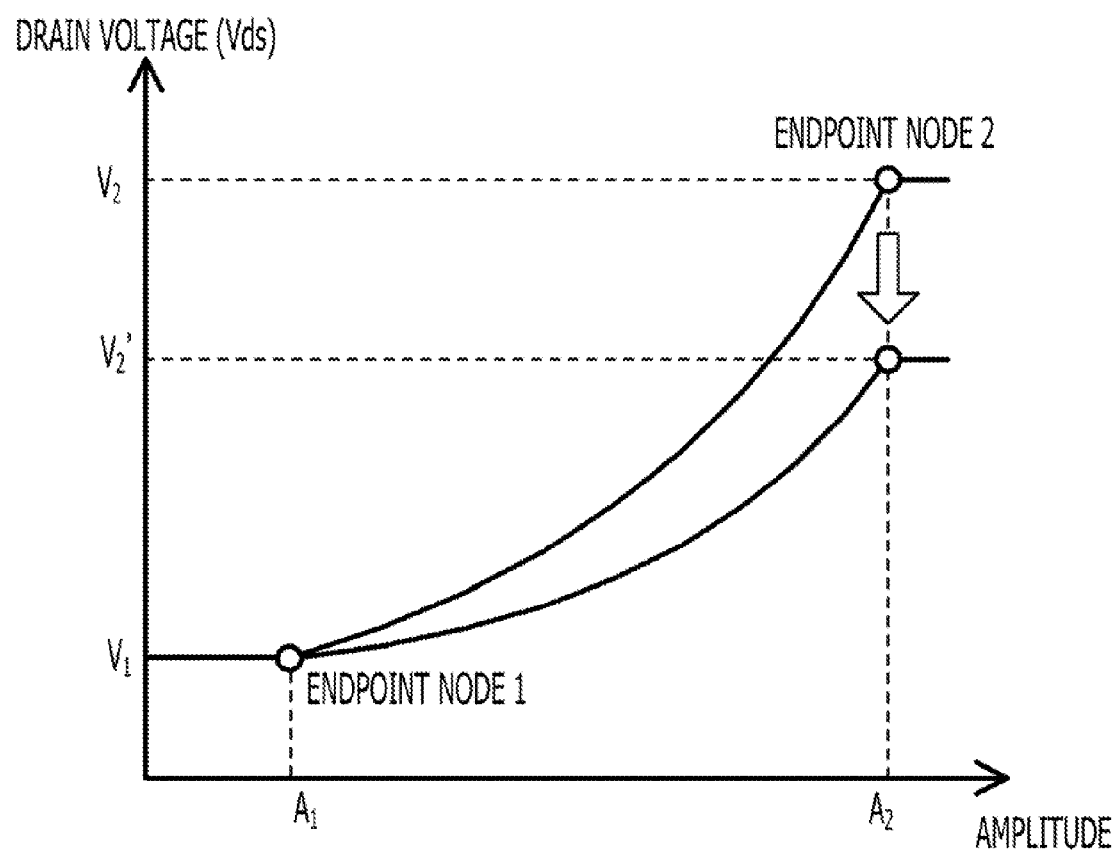
FIG. 11 is a diagram illustrating an example of a manner of setting constraint points according to an embodiment 3.

FIG. 11 is a diagram illustrating an example of a manner of setting constraint points according to an embodiment 3. In the embodiment 2, the endpoint node is adjusted in an amplitude changing direction (a direction in which the amplitude changes) of the envelope. On the other hand, in the embodiment 3, the endpoint node is adjusted in a drain voltage changing direction (a direction in which the drain voltage changes) of the envelope.

It is assumed that the endpoint node 2 is set as an upper limit end of a range which is expressed using a polynomial series. In the above mentioned situation, the amplitude at the endpoint node 2 is constrained to $A_2$ and the voltage $V_2$ is adjusted, thereby adjusting a voltage range within which the voltage is output in proportion to the slope of a curve expressed by a polynomial series.

Figure 12:
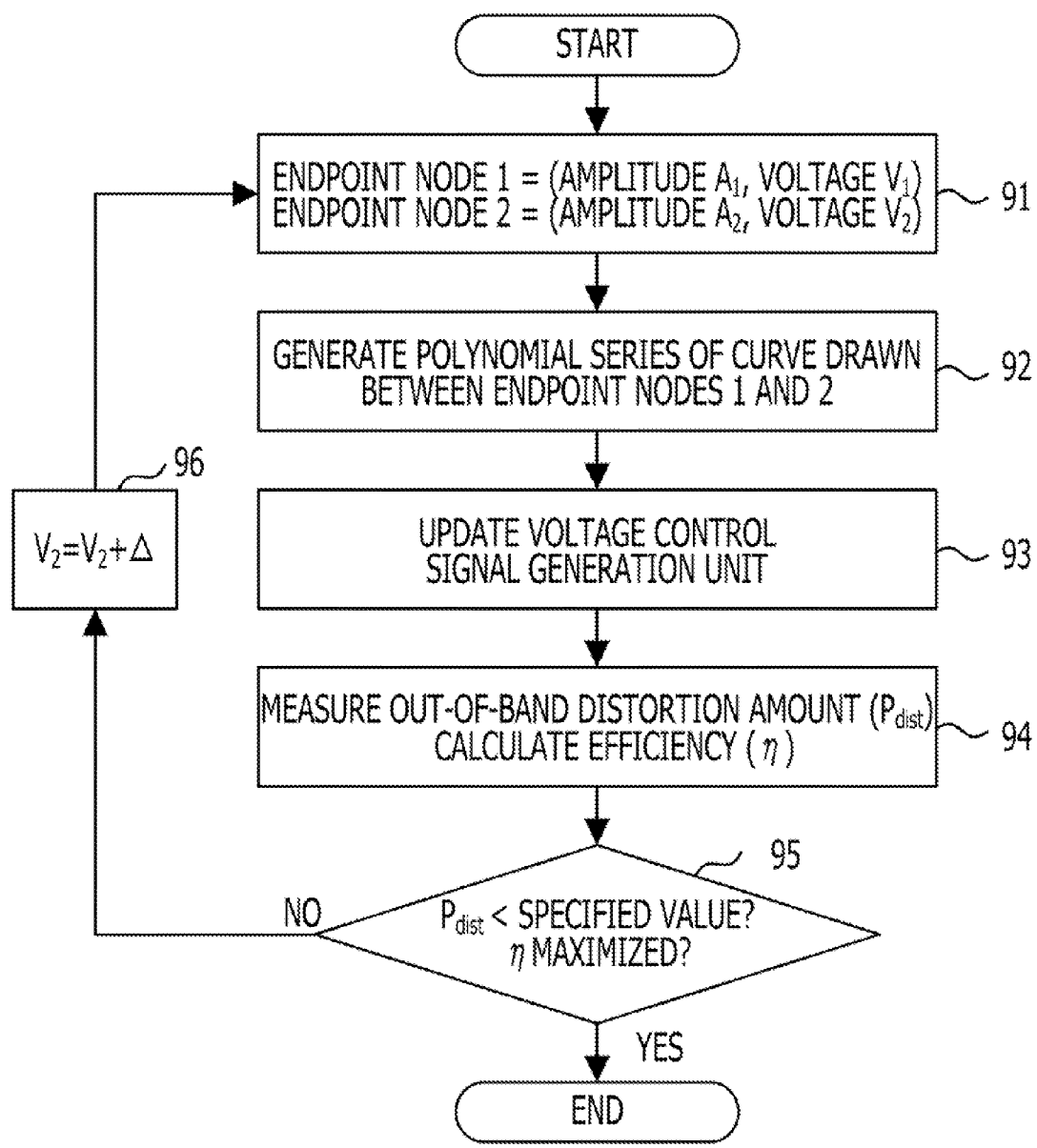
FIG. 12 is a diagram illustrating an example of a flowchart of an operation of an adaptive control unit according to an embodiment 3.

FIG. 12 is a diagram illustrating an example of a flowchart of the controlling operation of the adaptive control unit according to the embodiment 3. The adaptive control unit 36 determines the initial values at the endpoint node 1 (the amplitude: $A_1$, the voltage: $V_1$) and the endpoint node 2 (the amplitude: $A_2$, the voltage: $V_2$) (step 91). Then, the adaptive control unit 36 generates a polynomial series of a curve which is drawn between the endpoint nodes 1 and 2 while changing the voltage $V_2$ at the endpoint node 2 by a value $\Delta$ each time (step 92) and updates the contents of the voltage control signal generation unit 24 (step 93). Then, the adaptive control unit 36 measures a Pout and an out-of-band distortion level Pdist of the power amplifier from a feedback signal in an output from the power amplifier to measure a power consumption Psrc of the variable power source so as to calculate an efficiency $\eta$=Pout/Psrc of the power amplifier every time the voltage $V_2$ at the upper limit end is set (step 94). Next, the loop is repeated until the voltage $V_2$ of a value with which the out-of-band distortion level Pdist is less than a specified value which has been determined in advance and the efficiency $\eta$ is maximized is found (steps 95 and 96). As an alternative, the position of a lower limit end may be adjusted, instead of adjusting the upper limit end or adjustment of the positions of the both endpoint nodes may be possible.

According to the above mentioned operation, it may become possible to adjust the endpoint nodes to optimum positions.

Embodiment 4

Figure 13:
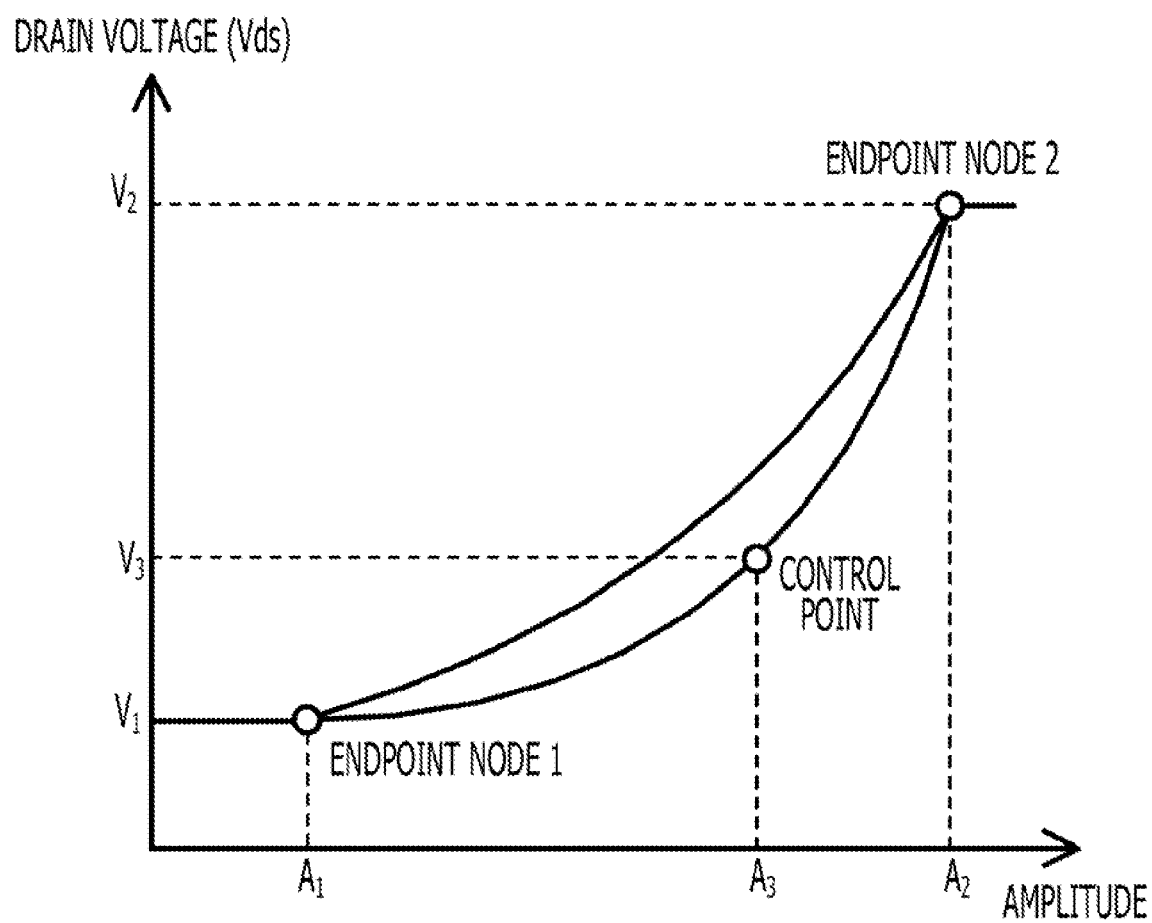
FIG. 13 is a diagram illustrating an example of a manner of setting constraint points and a control point according to an embodiment 4.

FIG. 13 is a diagram illustrating an example of a manner of setting constraint points and a control point according to an embodiment 4. The embodiment 4 is the same as the embodiments 1 to 3 in that the constraint points are set at the both ends of a section which is expressed by a polynomial series to determine an amplitude range and a voltage range and differs from the embodiments 1 to 3 in that the polynomial series is controlled by adjusting a control point which is set between the both endpoint nodes.

In the example illustrated in the drawing, the endpoint nodes are constraint points between which a curve expressed by a polynomial series normally runs. However, a curve expressed by a polynomials series need not necessarily pass the control point. Next, although description will be made under the assumption that the curve expressed by the polynomial series passes the control point for the simplification of explanation, when the polynomial series is determined by using, for example, a Bezier curve, the curve expressed by the polynomial series need not necessarily pass the control point. The same thing also applies to embodiments 5 and 7 which will be described later.

Figure 14:
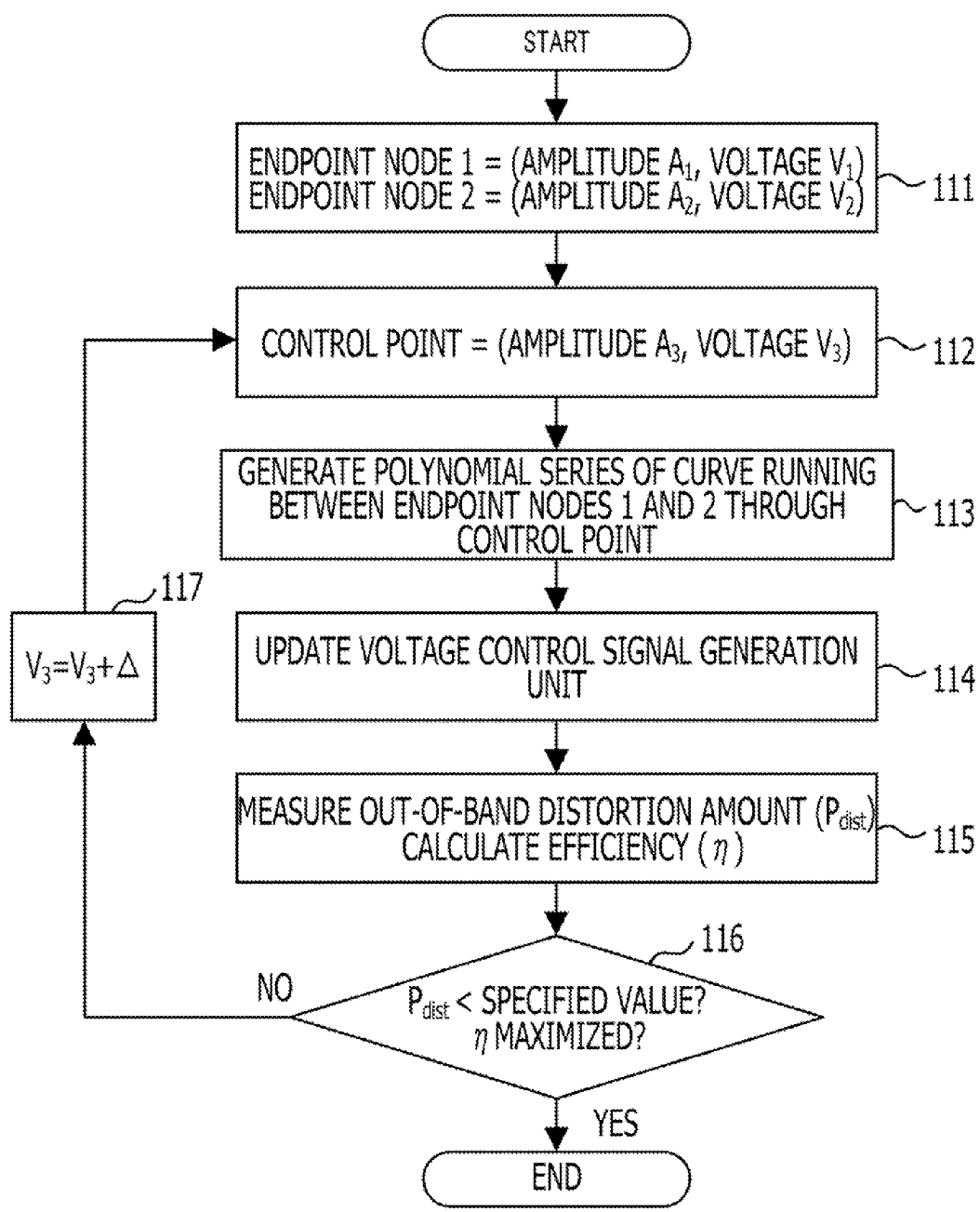
FIG. 14 is a diagram illustrating an example of a flowchart of an operation of an adaptive control unit according to the embodiment 4.

An example of controlling the control point in a voltage changing direction will be described with reference to FIG. 14 which illustrates an example of a flowchart of the operation of the adaptive control unit according to the embodiment 4.

The adaptive control unit 36 determines the initial values of the endpoint node 1 (the amplitude: $A_1$, the voltage: $V_1$) and the endpoint node 2 (the amplitude: $A_2$, the voltage: $V_2$) (step 111) and then determines the initial value of the control point (the amplitude: $A_3$, the voltage: $V_3$) (step 112).

The adaptive control unit 36 which has set the endpoint nodes 1 and 2 and the control point generates a polynomial series of a curve which runs between the endpoint nodes 1 and 2 through the control point while changing the voltage $V_3$ at the control point by a value Δ each time (step 113) and updates the contents of the voltage control signal generation unit 24 (step 114). Then, the adaptive control unit 36 measures a Pout and an out-of-band distortion level Pdist of the power amplifier from a feedback signal in an output from the power amplifier to measure a power consumption Psrc of the variable power source so as to calculate an efficiency η=Pout/Psrc of the power amplifier every time the voltage $V_3$ at the control point is set (step 115). Next, the loop is repeated until the voltage $V_3$ of a value with which the out-of-band distortion level Pdist is less than a specified value which has been determined in advance and the efficiency η is maximized is found (steps 116 and 117). Incidentally, a direction in which the control point is moved is not limited to the voltage changing direction and the control point may be moved in an amplitude changing direction. In addition, adjustment of the control point by moving it in the both voltage changing and amplitude changing directions may be possible.

Embodiment 5

FIG. 15 is a diagram illustrating an example of a manner of dividing an amplitude range into sections according to an embodiment 5. An amplitude range $A_1$-$A_2$ to be expressed by polynomial series is divided into a section 1 ($A_1$-$A_3$) and a section 2 ($A_3$-$A_2$) and the respective sections are expressed by different polynomial series. The polynomial series which expresses each section is generated by constraining the both endpoint nodes of the section and controlling the position of a control point which is set between the both endpoint nodes. Description will be made with reference to FIGS. 16A, 16B, 16C and 16D. FIGS. 16A, 16B, 16C and 16D are diagrams illustrating examples of a process along which the polynomial series are generated according to the embodiment 5.

Figure 16A:
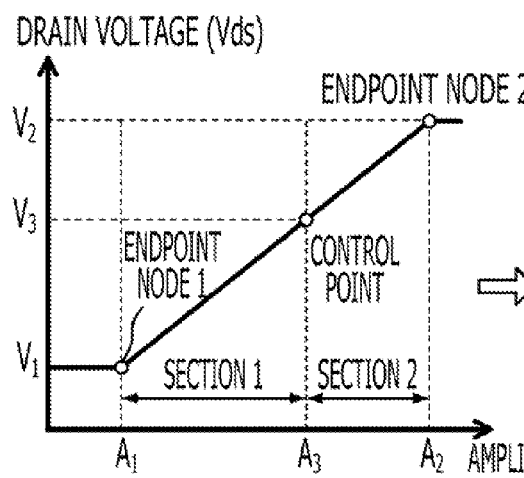
FIG. 16A is a diagram illustrating a step of a process along which polynomial series are generated according to the embodiment 5.
Figure 16B:
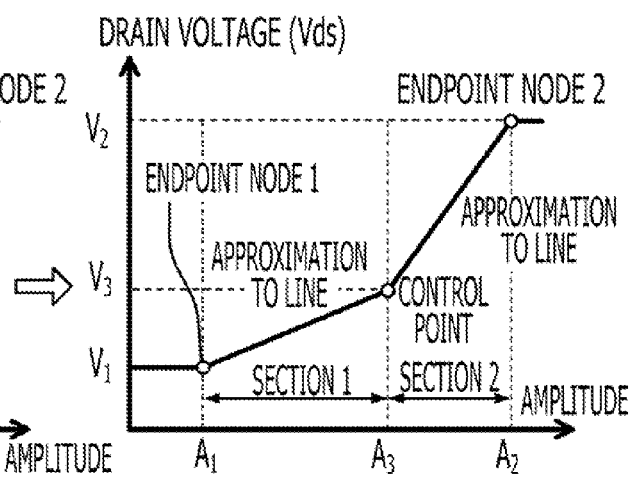
FIG. 16B is a diagram illustrating another step of the process along which polynomial series are generated according to the embodiment 5.
Figure 16C:
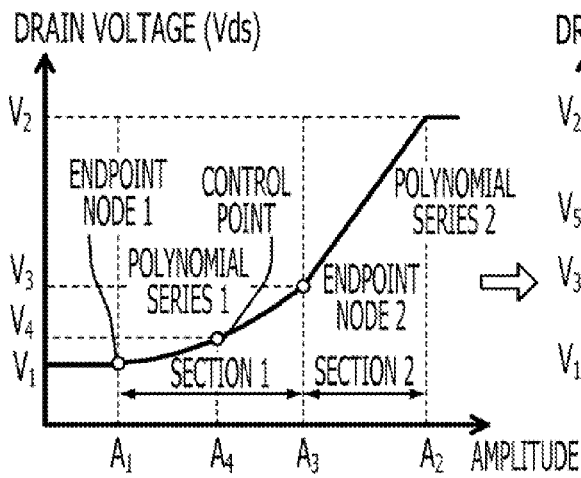
FIG. 16C is a diagram illustrating another step of the process along which polynomial series are generated according to the embodiment 5.
Figure 16D:
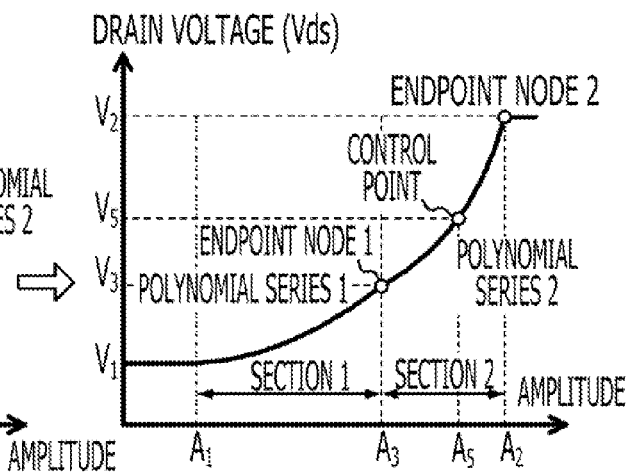
FIG. 16D is a diagram illustrating another step of the process along which polynomial series are generated according to the embodiment 5.

First within the amplitude range $A_1$-$A_2$, the endpoint nodes 1 and 2 are constrained and the position of the control point is controlled in the voltage changing direction (FIG. 16A→FIG. 16B). Then, the endpoint nodes (the endpoint node 1 and the control point in FIGS. 16A and 16B) of the section 1 are constrained and a fresh control point is set between the endpoint nodes to generate a polynomial series 1 for the section 1 (FIG. 16B→FIG. 16C). Finally, the endpoint nodes (the control point and the endpoint node 2 in FIGS. 16A and 16B) of the section 2 are constrained and a fresh control point is set between the both endpoint nodes to generate a polynomial series 2 for the section 2 (FIG. 16C→FIG. 16D).

Figure 17:
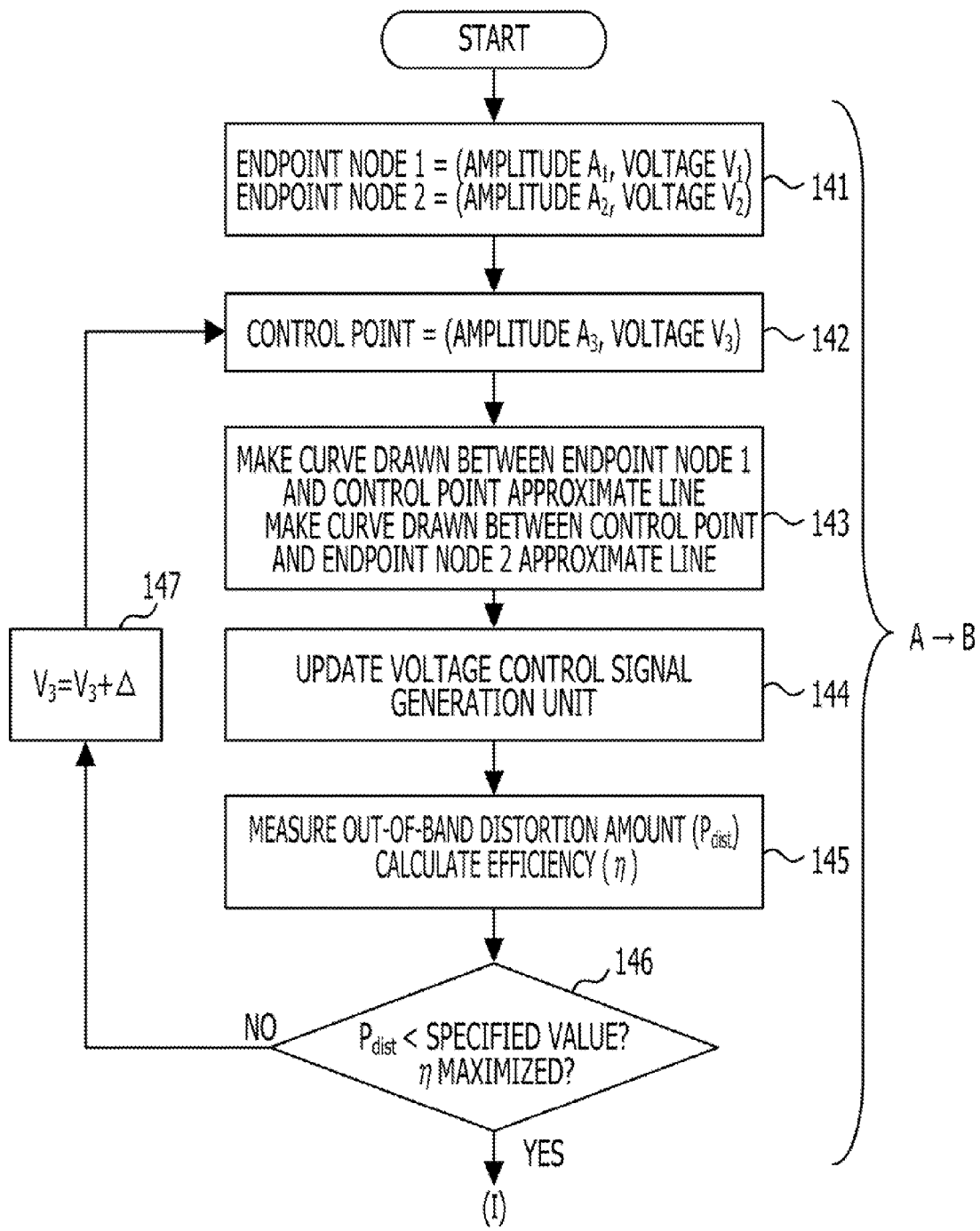
FIG. 17 is a diagram illustrating an example of a flowchart (1) of an operation of an adaptive control unit according to the embodiment 5.
Figure 18:
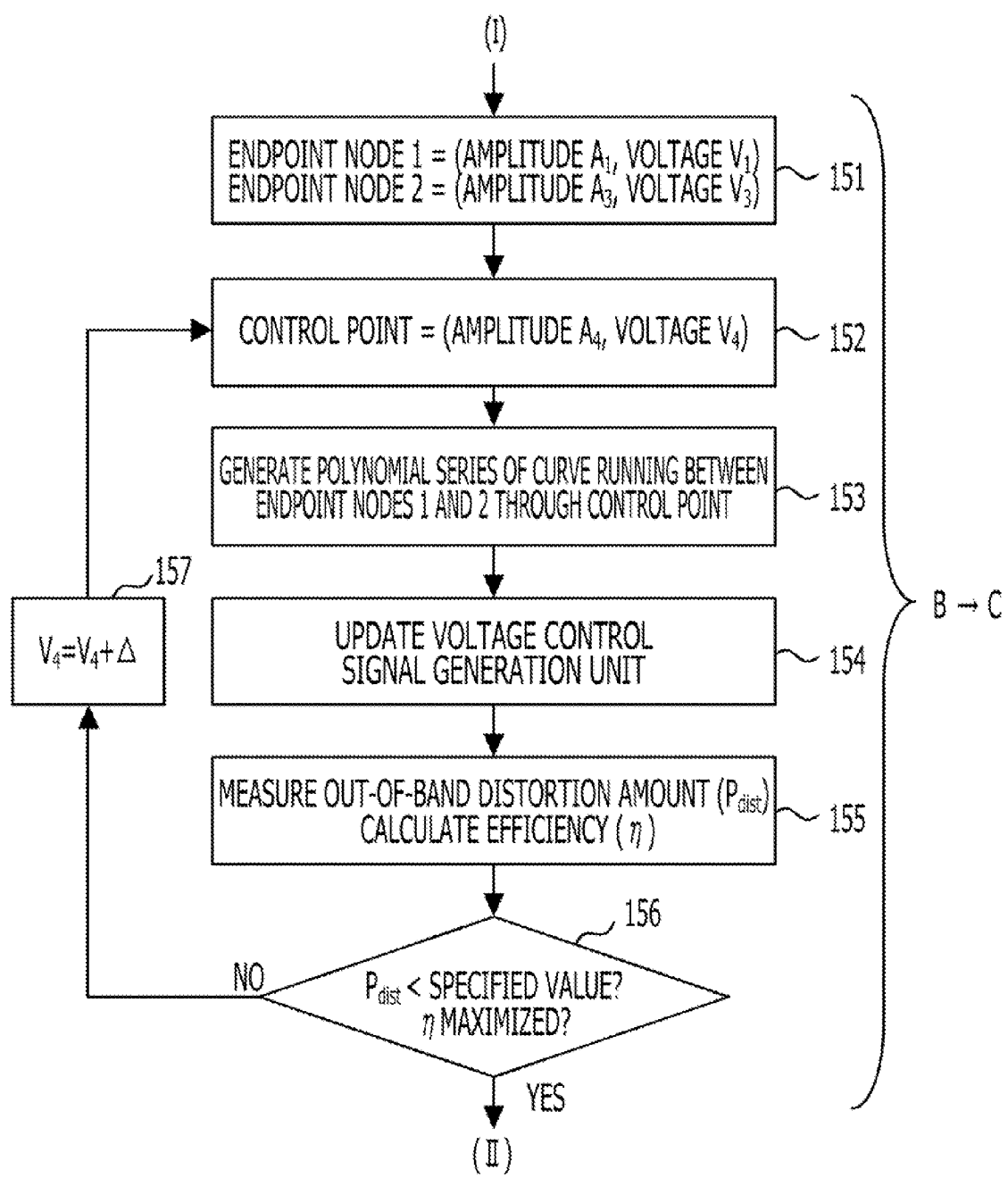
FIG. 18 is a diagram illustrating an example of a flowchart (2) of the operation of the adaptive control unit according to the embodiment 5.
Figure 19:
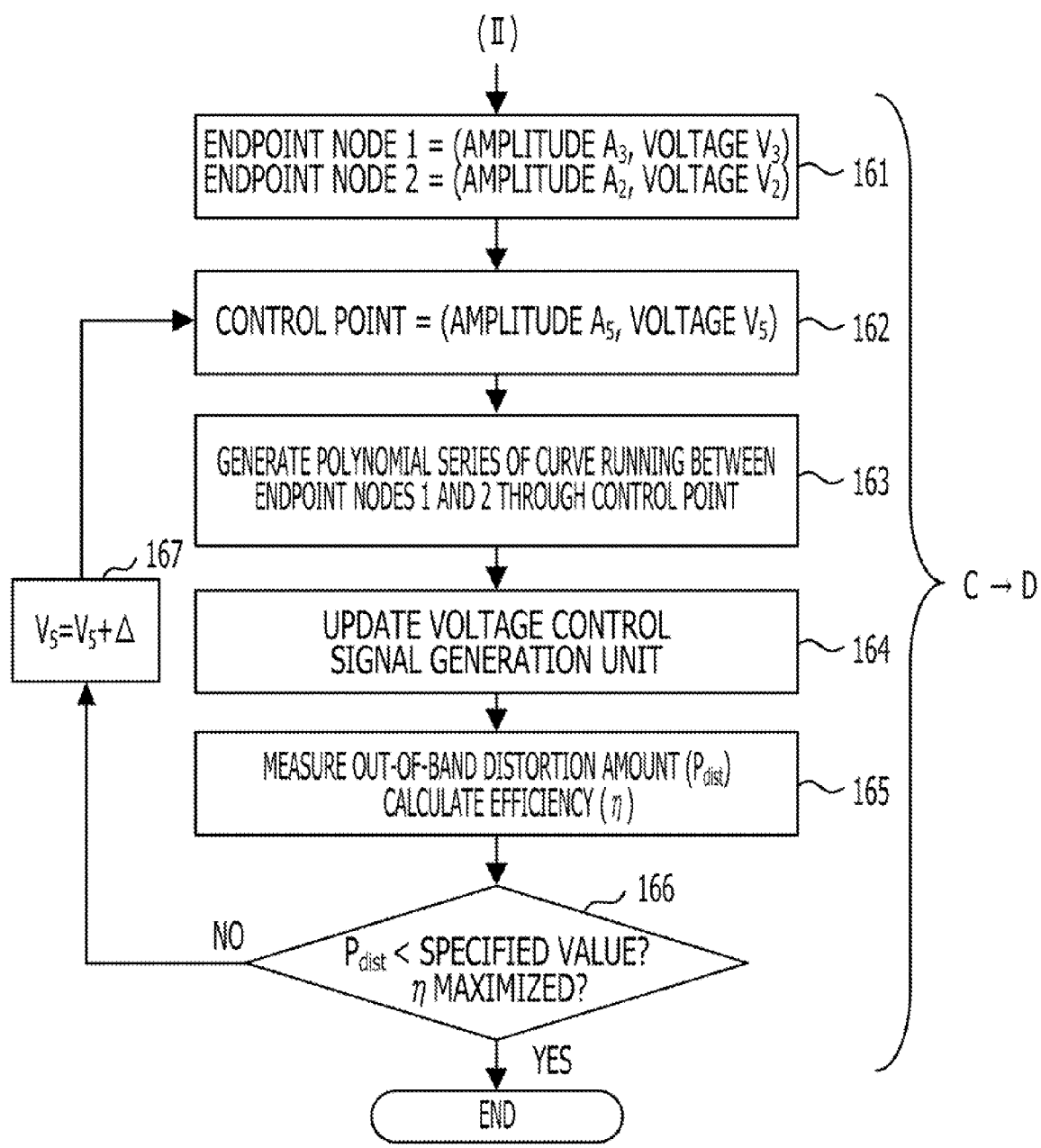
FIG. 19 is a diagram illustrating an example of a flowchart (3) of the operation of the adaptive control unit according to the embodiment 5.

FIGS. 17, 18 and 19 are diagrams illustrating examples of a series of flowcharts of the operation of the adaptive control unit according to the embodiment 5.

The adaptive control unit 36 determines the initial values at the endpoint node 1 (the amplitude: $A_1$, the voltage: $V_1$) and the endpoint node 2 (the amplitude: $A_2$, the voltage: $V_2$) (step 141) and then determines the initial value at the control point (the amplitude: $A_3$, the voltage: $V_3$) (step 142). Then, the adaptive control unit 36 which has set the endpoint nodes and the control point makes the section between the endpoint node 1 and the control point approximate a straight line and makes the section between the control point and the endpoint node 2 approximate a straight line while changing the voltage $V_3$ at the control point by a value Δ each time (step 143) and updates the contents of the voltage control signal generation unit 24 (step 144). Then, the adaptive control unit 36 measures a Pout and an out-of-band distortion level Pdist of the power amplifier from a feedback signal in an output from the power amplifier to measure a power consumption Psrc of the variable power source so as to calculate an efficiency η=Pout/Psrc of the power amplifier every time the voltage $V_3$ at the control point is set (step 145). Next, the loop is repeated until the voltage $V_3$ of a value with which the out-of-band distortion level Pdist is less than a specified value which has been determined in advance and the efficiency η is maximized is found (steps 146 and 147). Incidentally, a direction in which the control point is moved is not limited to the voltage changing direction and the control point may be moved in an amplitude changing direction. In addition, adjustment of the control point by moving it in the both voltage changing and amplitude changing directions may be possible.

Next, the adaptive control unit 36 determines the initial values of the endpoint node 1 (the amplitude: $A_1$, the voltage: $V_1$) and the endpoint node 2 (the amplitude: $A_3$, the voltage: $V_3$) (step 151) and then determines the initial value of the control point (the amplitude: $A_4$, the voltage: V4) (step 152). Then, the adaptive control unit 36 which has set the endpoint nodes 1 and 2 and the control point generates the polynomial series of one curve which runs between the endpoint nodes 1 and 2 through the control point while changing the voltage $V_4$ at the control point by a value Δ each time (step 153) and updates the contents of the voltage control signal generation unit 24 (step 154). Then, the adaptive control unit 36 measures a Pout and an out-of-band distortion level Pdist of the power amplifier from a feedback signal in an output from the power amplifier to measure a power consumption Psrc of the variable power source so as to calculate an efficiency η=Pout/Psrc of the power amplifier every time the voltage $V_4$ at the control point is set (step 155). Next, the loop is repeated until the voltage $V_4$ of a value with which the out-of-band distortion level Pdist is less than a specified value which has been determined in advance and the efficiency η is maximized is found (steps 156 and 157). Incidentally, a direction in which the control point is moved is not limited to the voltage changing direction and the control point may be moved in an amplitude changing direction. In addition, adjustment of the control point by moving it in the both voltage changing and amplitude changing directions may be possible.

Finally the adaptive control unit 36 determines the initial values of the endpoint node 1 (the amplitude: $A_1$, the voltage: $V_1$) and the endpoint node 2 (the amplitude: $A_3$, the voltage: $V_3$) (step 161) and determines the initial value of the control point (the amplitude: $A_5$, the voltage: $V_5$) (step 162). The adaptive control unit 36 which has set the endpoint nodes 1 and 2 and the control point generates the polynomial series of another curve which runs between the endpoint nodes 1 and 2 through the control point while changing the voltage $V_5$ at the control point by a value Δ each time (step 163) and updates the contents of the voltage control signal generating unit 24 (step 164). Next, the adaptive control unit 36 measures a Pout and an out-of-band distortion level Pdist of the power amplifier from a feedback signal in an output from the power amplifier to measure a power consumption Psrc of the variable power source so as to calculate an efficiency η=Pout/Psrc of the power amplifier every time the voltage $V_5$ at the control point is set (step 165). Next, the loop is repeated until the voltage $V_5$ of a value with which the out-of-band distortion level Pdist is less than a specified value which has been determined in advance and the efficiency η is maximized is found (steps 166 and 167). Incidentally, a direction in which the control point is moved is not limited to the voltage changing direction and the control point may be moved in an amplitude changing direction. In addition, adjustment of the control point by moving it in the both voltage changing and amplitude changing directions may be possible.

According to the above mentioned operations, one section may be divided into two sections and hence it may become possible to generate an envelope-drain voltage conversion curve which is higher in efficiency by using polynomial series which are lower in order than those ever used.

Embodiment 6

Figure 20A:
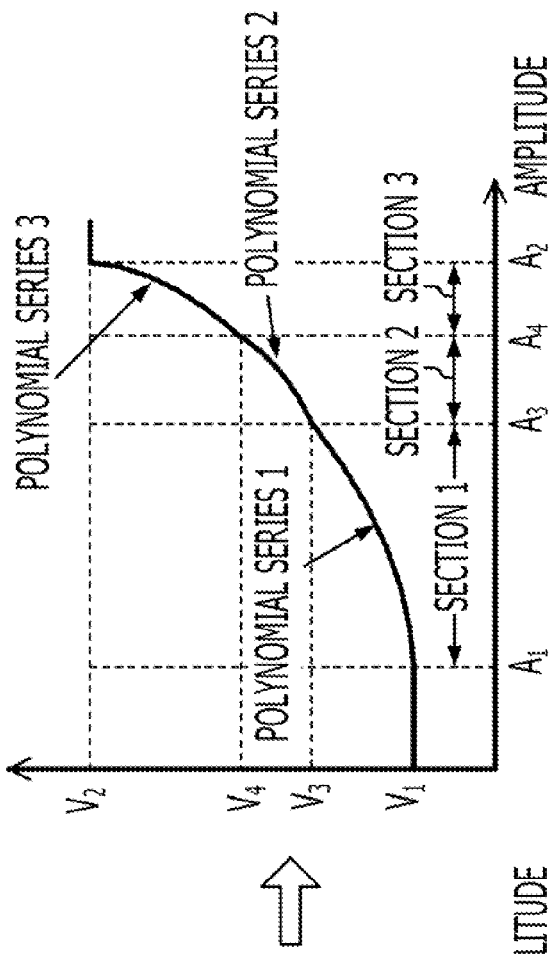
FIG. 20A is a diagram illustrating a step of a process along which polynomial series are generated according to an embodiment 6.
Figure 20B:
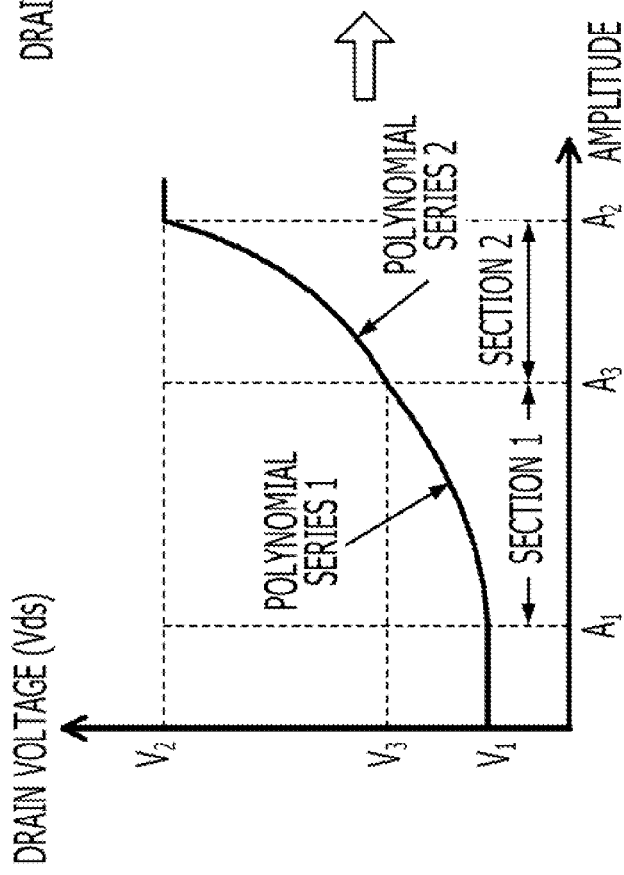
FIG. 20B is a diagram illustrating another step of the process along which polynomial series are generated according to the embodiment 6.

FIGS. 20A and 20B are diagrams illustrating examples of a process along which polynomial series are generated according to an embodiment 6. In the embodiment 6, after one section has been divided into two sections according to the embodiment 5, one section which is larger in amplitude is further divided into two sections. FIG. 20A illustrates a state in which one section is divided into two sections according to the embodiment 5. In the embodiment 6, one of the two sections so divided which is larger in amplitude than another section is further divided into two sections.

According to the above mentioned operation, one section may be divided into a plurality of sections and hence it may become possible to generate an envelope-drain voltage conversion curve which is higher in efficiency by using polynomial series which are lower in order than those ever used.

Embodiment 7

Figure 21A:
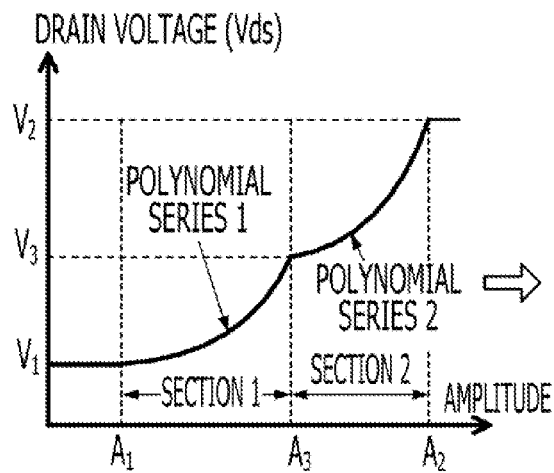
FIG. 21A is a diagram illustrating a step of a process along which polynomial series are generated according to an embodiment 7.
Figure 21B:
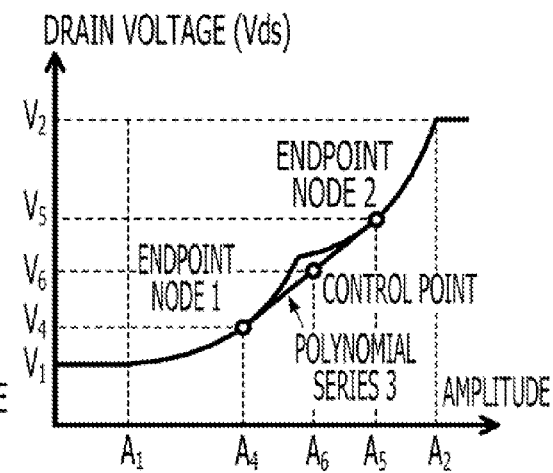
FIG. 21B is a diagram illustrating another step of the process along which polynomial series are generated according to the embodiment 7.
Figure 21C:
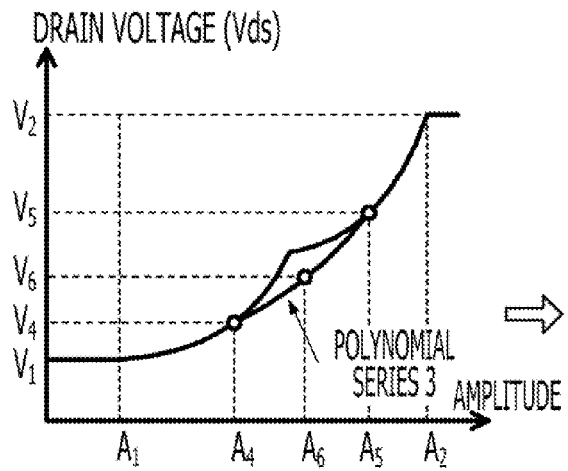
FIG. 21C is a diagram illustrating another step of the process along which polynomial series are generated according to the embodiment 7.
Figure 21D:
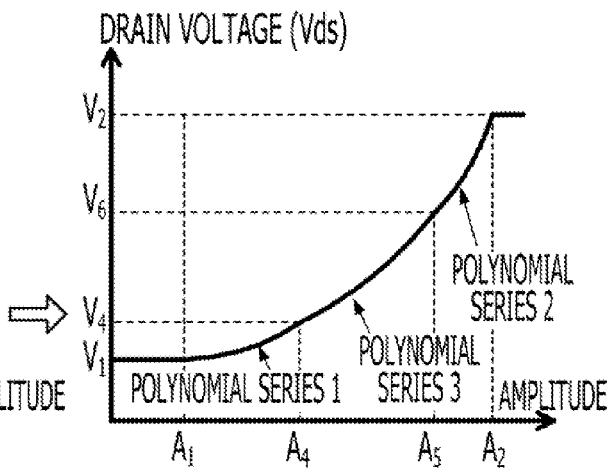
FIG. 21D is a diagram illustrating another step of the process along which polynomial series are generated according to the embodiment 7.

FIGS. 21A, 21B, 21C and 21D are diagrams illustrating examples of a process along which polynomial series are generated according to an embodiment 7. In the embodiment 7, after one section has been divided into two sections according to the embodiment 5, a polynomial series for a line which strides over a boundary between adjacent sections is generated. FIG. 21A illustrates a state in which one section is divided into two sections according to the embodiment 5. In the embodiment 7, the endpoint node 1 is set on a curve generated in accordance with a polynomial series 1 in a section 1, the endpoint node 2 is set on a curve generated in accordance with a polynomial series 2 in a section 2 and the control point is set between the both endpoint nodes (FIG. 21A→FIG. 21B). Then, the control point is adjusted to generate a polynomial series 3 for a line which runs striding over the boundary between two sections (FIG. 21B→FIG. 21C). As a result, the polynomial series 3 for the line that smoothly joins two sections with each other in a boundary-free state is introduced (FIG. 21C→FIG. 21D).

FIG. 22 is a diagram illustrating an example of a flowchart of the operation of the adaptive control unit according to the embodiment 7. The adaptive control unit 36 generates polynomial series for two sections by the controlling method which has been described in the embodiment 5 (step 171). Then, the adaptive control unit 36 determines the initial values of the endpoint node 1 (the amplitude: $A_4$, the voltage: $V_4$) and the endpoint node 2 (the amplitude: $A_5$, the voltage: $V_5$) (step 172) and determines the initial value of the control point (the amplitude: $A_6$, the voltage $V_6$) (step 173). The adaptive control unit 36 which has set the endpoint nodes 1 and 2 and the control point generates the polynomial series for the line which runs between the endpoint nodes 1 and 2 through the control point while changing the voltage $V_6$ at the control point by a value $\Delta$ each time (step 174) and updates the contents of the voltage control signal generating unit 24 (step 175). Next, the adaptive control unit 36 measures a Pout and an out-of-band distortion level Pdist of the power amplifier from a feedback signal in an output from the power amplifier to measure a power consumption Psrc of the variable power source so as to calculate an efficiency $\eta$=Pout/Psrc of the power amplifier every time the voltage $V_6$ at the control point is set (step 176). Next, the loop is repeated until the voltage $V_6$ of a value with which the out-of-band distortion level Pdist is less than a specified value which has been determined in advance and the efficiency $\eta$ is maximized is found (steps 177 and 178). Incidentally, a direction in which the control point is moved is not limited to the voltage changing direction and the control point may be moved in an amplitude changing direction. In addition, adjustment of the control point by moving it in the both voltage changing and amplitude changing directions may be possible.

The embodiments of the present invention have been described by giving specific examples thereof. Use of the constraint points in the generation of the envelope-drain voltage conversion curve may make it possible to express the region within which the control of the drain voltage is appropriate and/or necessary using the polynomial series. In addition, the range within which the control of the drain voltage is appropriate and/or necessary is divided into a plurality of sections and each section is expressed using a lower-order polynomial series, so that it may become possible to generate a highly accurate voltage control signal while reducing the number of arithmetic operations to be executed to obtain the polynomial series. As a result, the power efficiency of the radio communication device using the ET type power amplifier may be increased.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the invention have been described in detail, it should be understood that the various changes, substitutions, and alterations could be made hereto without departing from the spirit and scope of the invention.

The invention claimed is:

1. A radio communication device comprising:
a power amplifier to amplify a transmit signal;
a control unit to generate a voltage control signal for defining power to be supplied to the power amplifier in accordance with a conversion curve expressed using a polynomial series based on an envelope signal obtained from the transmit signal and determine the polynomial series based on an efficiency of the power amplifier; and
a power source unit to supply the power to the power amplifier based on the voltage control signal, wherein
the control unit divides an amplitude range of the envelope signal on the conversion curve into a plurality of sections and determines the polynomial series based on at least one of the plurality of sections.

2. The radio communication device according to claim 1, wherein
the conversion curve is drawn between endpoint nodes of the at least one of the plurality of sections of the conversion curve.

3. The radio communication device according to claim 2, wherein
the control unit adjusts at least one of the endpoint nodes in an amplitude changing direction of the envelope signal on the conversion curve or in a voltage changing direction of the voltage control signal on the conversion curve on the basis of the efficiency and an out-of-band distortion amount of the power amplifier.

4. The radio communication device according to claim 1, wherein
the control unit controls a control point which is disposed between endpoint nodes of the at least one of the plurality of sections of the conversion curve to determine the polynomial series of the conversion curve on the basis of the efficiency and an out-of-band distortion amount of the power amplifier.

5. The radio communication device according to claim 4, wherein
the control unit adjusts the control point in an amplitude changing direction of the envelope signal or in a voltage changing direction of the voltage control signal on the basis of the efficiency and the out-of-band distortion amount of the power amplifier.

6. The radio communication device according to claim 1, wherein
the control unit prepares a boundary section that includes a boundary between adjacent sections of the plurality of sections and determines a boundary polynomial series of a conversion curve for the boundary section,
the polynomial series based on the envelope signal is based at least in part on the boundary polynomial series.

7. A radio communication method comprising:
amplifying a transmit signal using a power amplifier;
obtaining an envelope signal from the transmit signal;
dividing an amplitude range of the envelope signal into a plurality of sections;
determining a polynomial series of at least one of the plurality of sections, the polynomial series being based on an efficiency of the power amplifier;
generating a voltage control signal for defining power to be supplied to the power amplifier in accordance with a conversion curve expressed using the polynomial series; and
supplying the power to the power amplifier based on the voltage control signal.

8. The radio communication method according to claim 7, wherein
the determining the polynomial series includes determining the polynomial series of the conversion curve which is drawn between endpoint nodes as boundary points of the one of the plurality of sections of the conversion curve.

9. The radio communication method according to claim 8, wherein
the determining the polynomial series includes adjusting at least one of the endpoint nodes in an amplitude changing direction of the envelope signal on the conversion curve or in a voltage changing direction of the voltage control signal on the conversion curve on the basis of the efficiency and an out-of-band distortion amount of the power amplifier.

10. The radio communication method according to claim 7, wherein
the determining the polynomial series includes controlling a control point which is disposed between endpoint nodes of at least one of the plurality of sections of the conversion curve and determining the polynomial series of the conversion curve based on the efficiency and an out-of-band distortion amount of the power amplifier.

11. The radio communication method according to claim 10, wherein
the determining the polynomial series includes adjusting the control point in an amplitude changing direction of the envelope signal or in a voltage changing direction of the voltage control signal based on the efficiency and the out-of-band distortion amount of the power amplifier.

12. The radio communication method according to claim 7, wherein
the determining the polynomial series further includes preparing a boundary section that includes a boundary between adjacent sections of the plurality of sections; determining a boundary polynomial series of a conversion curve for the boundary section; and synthesizing the boundary polynomial series with the polynomial series of the adjacent sections.

13. A radio communication device comprising:
a power amplifier to amplify a transmit signal;
a control unit to
obtain an envelope signal from the transmit signal,
divide an amplitude range of the envelope signal into a plurality of sections,
to determine a polynomial series of at least one section of the plurality of sections,
to generate a voltage control signal in accordance with a conversion curve expressed using the polynomial series; and
a power source unit to supply the power to the power amplifier based on the voltage control signal.

14. The radio communication device according to claim 13, wherein the polynomial series is based on an efficiency of the power amplifier.

* * * * *